(12) United States Patent
Lee et al.

(10) Patent No.: US 12,368,982 B2
(45) Date of Patent: Jul. 22, 2025

(54) IMAGE SENSOR PREVENTING IMAGE DEGRADATION

(71) Applicant: Samsung Electronics Co., Ltd., Suwon-si (KR)

(72) Inventors: Jaekyu Lee, Suwon-si (KR); Kyoung Cho Na, Suwon-si (KR); Dongseok Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 153 days.

(21) Appl. No.: 18/240,000

(22) Filed: Aug. 30, 2023

(65) Prior Publication Data
US 2024/0244351 A1 Jul. 18, 2024

(30) Foreign Application Priority Data
Jan. 12, 2023 (KR) .................. 10-2023-0004970

(51) Int. Cl.
*H04N 25/78* (2023.01)
*H04N 25/60* (2023.01)
*H04N 25/76* (2023.01)
*H04N 25/772* (2023.01)
*H10F 39/18* (2025.01)

(52) U.S. Cl.
CPC .......... *H04N 25/78* (2023.01); *H04N 25/772* (2023.01); *H04N 25/60* (2023.01); *H04N 25/7795* (2023.01); *H10F 39/182* (2025.01)

(58) Field of Classification Search
None
See application file for complete search history.

(56) References Cited

U.S. PATENT DOCUMENTS

| | | | |
|---|---|---|---|
| 9,390,032 | B1 | 7/2016 | Baldwin |
| 10,033,952 | B2 | 7/2018 | Ohmaru |
| 10,757,350 | B2 | 8/2020 | Tashiro et al. |
| 10,868,056 | B2 | 12/2020 | Tashiro et al. |
| 10,930,685 | B2 | 2/2021 | Kwon et al. |
| 11,019,286 | B2 | 5/2021 | Shim et al. |
| 2022/0077216 | A1 | 3/2022 | Lim et al. |
| 2022/0094864 | A1* | 3/2022 | Lee ............ H04N 25/78 |
| 2022/0115317 | A1 | 4/2022 | Yang et al. |

* cited by examiner

*Primary Examiner* — Mark T Monk
(74) *Attorney, Agent, or Firm* — Muir Patent Law, PLLC

(57) ABSTRACT

Disclosed is an image sensor. Each of a plurality of pixels includes a photo diode, a transfer transistor connected between the photo diode and a floating diffusion node, a reset transistor connected between the floating diffusion node and a first power node to which a first power supply voltage is applied, a first source follower transistor including a gate connected to the floating diffusion node, a first terminal connected to a second power node to which a second power supply voltage is applied, and a second terminal connected to a first node, a precharge transistor connected between the first node and a floating node, a first precharge select transistor connected between the floating node and a ground node, a second precharge select transistor connected between the first node and a second node, and a first capacitor connected between a gate of the precharge transistor and the floating node.

20 Claims, 14 Drawing Sheets

IMAGE SENSOR PREVENTING IMAGE DEGRADATION

CROSS-REFERENCE TO RELATED APPLICATIONS

This application claims priority under 35 U.S.C. § 119 to Korean Patent Application No. 10-2023-0004970 filed on Jan. 12, 2023, in the Korean Intellectual Property Office, the disclosure of which is incorporated by reference herein in its entireties.

BACKGROUND

Embodiments of the present disclosure described herein relate to an electronic device, and more particularly, relate to an image sensor preventing an image quality from be degraded due to coupling between sub-lines of a row line.

An image sensor that captures an image and converts the captured image into an electrical signal is used in cameras mounted in vehicles, security devices, and robots, as well as general consumer electronic devices such as digital cameras, mobile phone cameras, and portable camcorders.

An image sensor may determine the amount of photo-electrons underlying the electrical signal, by adjusting an exposure time. The image sensor may adjust the exposure time by using a rolling shutter method and a global shutter method. In this case, the rolling shutter method may control a time to integrate (or accumulate) photoelectrons differently for each row of a pixel array. The global shutter method may equally control the time to integrate (or accumulate) photo-electrons with regard to different rows of the pixel array.

SUMMARY

Embodiments of the present disclosure provide an image sensor preventing an image quality of image data from being degraded due to coupling between sub-lines of a row line.

According to an embodiment, an image sensor includes a plurality of pixels connected to a plurality of row lines and a plurality of column lines. Each of the plurality of pixels includes a photo diode, a transfer transistor connected between the photo diode and a floating diffusion node, a reset transistor connected between the floating diffusion node and a first power node to which a first power supply voltage is applied, a first source follower transistor including a gate connected to the floating diffusion node, a first terminal connected to a second power node to which a second power supply voltage is applied, and a second terminal connected to a first node, a precharge transistor connected between the first node and a floating node, a first precharge select transistor connected between the floating node and a ground node, a second precharge select transistor connected between the first node and a second node, and a first capacitor connected between a gate of the precharge transistor and the floating node.

According to an embodiment, an image sensor includes a plurality of pixels connected to a plurality of row lines and a plurality of column lines. Each of the plurality of pixels includes a photo diode, a transfer transistor connected between the photo diode and a floating diffusion node, a reset transistor connected between the floating diffusion node and a first power node to which a first power supply voltage is applied, a first source follower transistor including a gate connected to the floating diffusion node, a first terminal connected to a second power node to which a second power supply voltage is applied, and a second terminal connected to a first node, a first precharge select transistor connected between the first node and a second node, a precharge transistor connected between the first node and a floating node, a second precharge select transistor connected between the precharge transistor and a ground node, and a capacitor connected between a gate of the precharge transistor and the ground node.

According to an embodiment, an image sensor includes a plurality of pixels connected to a plurality of row lines and a plurality of column lines, and a row driver connected to the plurality of pixels through the plurality of row lines. Each of the plurality of pixels includes a photo diode, a transfer transistor connected between the photo diode and a floating diffusion node, a reset transistor connected between the floating diffusion node and a first power node to which a first power supply voltage is applied, a first source follower transistor including a gate connected to the floating diffusion node, a first terminal connected to a second power node to which a second power supply voltage is applied, and a second terminal connected to a first node, a precharge transistor connected between the first node and a floating node, a first precharge select transistor connected between the floating node and a ground node, a second precharge select transistor connected between the first node and a second node, a first capacitor and a first sampling transistor connected between a third power node to which a third power supply voltage is applied and the second node, a second capacitor and a second sampling transistor connected between the third power node and the second node, a second source follower transistor including a gate connected to the second node, a first terminal to which a fourth power supply voltage is applied, and a second terminal, a select transistor connected to the second terminal of the second source follower transistor and a corresponding column line among the plurality of column lines, and a third capacitor connected between a gate of the precharge transistor and the floating node. Each of the plurality of pixels further includes a substrate including the photo diode and an active area, a semiconductor pattern area on the substrate and forming the transfer transistor, the reset transistor, the first source follower transistor, the precharge transistor, the first precharge select transistor, the second precharge select transistor, the first sampling transistor, the second sampling transistor, the second source follower transistor, and the select transistor together with the active area, and a metal pattern area on the semiconductor pattern area and including the plurality of row lines, the plurality of column lines, the first capacitor, the second capacitor, and the third capacitor. The first capacitor, the second capacitor, and the third capacitor are manufactured by the same process. Each of the first capacitor, the second capacitor, and the third capacitor includes an OSC (One Cylinder Stack) type capacitor or a pillar type capacitor.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure will be described in detail and clearly to such an extent that an ordinary one in the art can easily implement the present disclosure. Below, the term "and/or" is interpreted as including any one of items listed with regard to the term, or a combination of some of the listed items.

Figure 1:
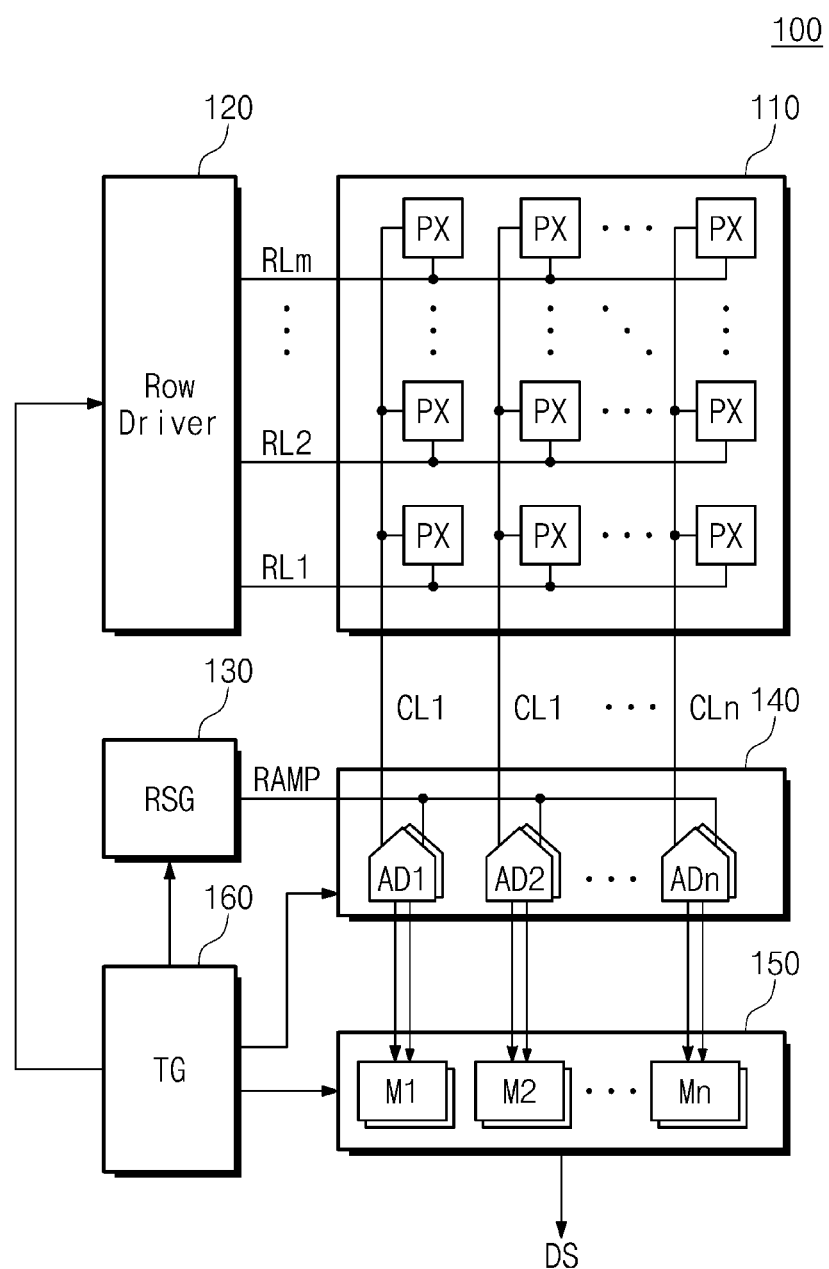
FIG. 1 illustrates an image sensor according to an embodiment of the present disclosure.

FIG. 1 illustrates an image sensor 100 according to an embodiment of the present disclosure. Referring to FIG. 1, the image sensor 100 may include a pixel array 110, a row driver 120, a ramp signal generator (RSG) 130, an analog-to-digital conversion circuit 140, a memory circuit 150, and a timing generator (TG) 160.

The pixel array 110 may include a plurality of pixels PX arranged in rows and columns in the form of a matrix. Each of the plurality of pixels PX may include a photo detector. For example, the photo detector may include a photo diode, a photo transistor, a photo gate, a pinned photodiode, etc. Each of the plurality of pixels PX may sense light by using the photo detector and may convert the amount of light thus sensed into an electrical signal, for example, a voltage or a current.

A color filter array (CFA) and lenses may be stacked on the pixel array 110. In one embodiment, the color filter array may include red (R) filters, green (G) filters, and blue (B) filters. Two or more different color filters may be disposed at the plurality of pixels PX. For example, at least one blue color filter, at least one red color filter, and at least two green color filters may be disposed for each group of four pixels of the plurality of pixels PX. Other color filter arrays may be used, however, and the embodiments are not limited to the one described in this example.

The row driver 120 may be connected to the rows of the pixels PX of the pixel array 110 through first to m-th row lines RL1 to RLm (m being a positive integer). Each of the first to m-th row lines RL1 to RLm may include a plurality of sub-lines connected in common to pixels of one row. The row driver 120 may decode an address and/or a control signal generated by the timing generator 160. Depending on a result of the decoding, the row driver 120 may simultaneously or sequentially select the first to m-th row lines RL1 to RLm of the pixel array 110 and may drive the plurality of sub-lines of the selected row line with a specific voltage. For example, the row driver 120 may drive the plurality of sub-lines of the first to m-th row lines RL1 to RLm with voltages appropriate for sensing a light or may drive the plurality of sub-lines of the selected row line with voltages appropriate for outputting the sensing voltage.

The plurality of sub-lines of each of the first to m-th row lines RL1 to RLm connected to the rows of the pixels PX may respectively transfer, for example, various signals including a signal for selecting (activating) photo detectors of a pixel, a signal for resetting a floating diffusion node, a signal for selecting a column line, a signal for adjusting a conversion gain (CG), etc.

The ramp signal generator 130 may generate a ramp signal RAMP. The ramp signal generator 130 may operate under control of the timing generator 160. For example, the ramp signal generator 130 may operate in response to control signals such as a ramp enable signal and a mode signal. In response to the ramp enable signal being activated, the ramp signal generator 130 may generate the ramp signal RAMP having a slope that is set based on the mode signal. For example, the ramp signal generator 130 may generate the ramp signal RAMP that continuously decreases or increases from an initial level over time.

The analog-to-digital conversion circuit 140 may be connected to the columns of the pixels PX of the pixel array 110 through first to n-th column lines CL1 to CLn (n being a positive integer). The analog-to-digital conversion circuit 140 may include first to n-th analog-to-digital converters AD1 to ADn respectively connected to the first to n-th column lines CL1 to CLn. The first to n-th analog-to-digital converters AD1 to ADn may receive the ramp signal RAMP from the ramp signal generator 130 in common.

The first to n-th analog-to-digital converters AD1 to ADn may compare voltages (or currents) of the first to n-th column lines CL1 to CLn with the ramp signal RAMP. The ramp signal RAMP refers to a signal that decreases (or increases) at a given rate. The first to n-th analog-to-digital converters AD1 to ADn may latch count values until the ramp signal RAMP is smaller (or greater) than pixel voltages (or pixel currents) of the first to n-th column lines CL1 to CLn and may convert and output the latched count values into digital values. That is, the first to n-th analog-to-digital converters AD1 to ADn may output the digital values corresponding to magnitudes of the voltages (or amounts of currents) output from the pixels PX to the first to n-th column lines CL1 to CLn.

Each of the first to n-th analog-to-digital converters AD1 to ADn may include at least two sub-converters. The sub-converters may be connected in common to the corresponding column line and may receive the ramp signal RAMP in common. Resolutions of the sub-converters may be equal or different. The sub-converters may be activated at different timings and may convert a voltage (or current) of the corresponding column line into different values (or digital signals), for example, pixel values.

The memory circuit 150 may include first to n-th memories M1 to Mn (e.g., memory cells) respectively corresponding to the first to n-th analog-to-digital converters AD1 to ADn. The first to n-th memories M1 to Mn may store the digital values (or digital signals) received from the first to n-th analog-to-digital converters AD1 to ADn and may output the stored values (or signals) as a digital signal DS.

The timing generator 160 may control timings at which the image sensor 100 operates. The timing generator 160 may control timings for the row driver 120 to simultaneously or sequentially select the first to m-th row lines RL1 to RLm and may control timings to transfer signals through two or more lines included in a row line selected from the first to m-th row lines RL1 to RLm.

The timing generator 160 may control the timing for the ramp signal generator 130 to generate the ramp signal RAMP and the timing for the ramp signal generator 130 to initialize the ramp signal RAMP. The timing generator 160 may control timings for the first to n-th analog-to-digital converters AD1 to ADn to start a count operation and a comparison operation and timings to initialize the first to n-th analog-to-digital converters AD1 to ADn.

Figure 2:
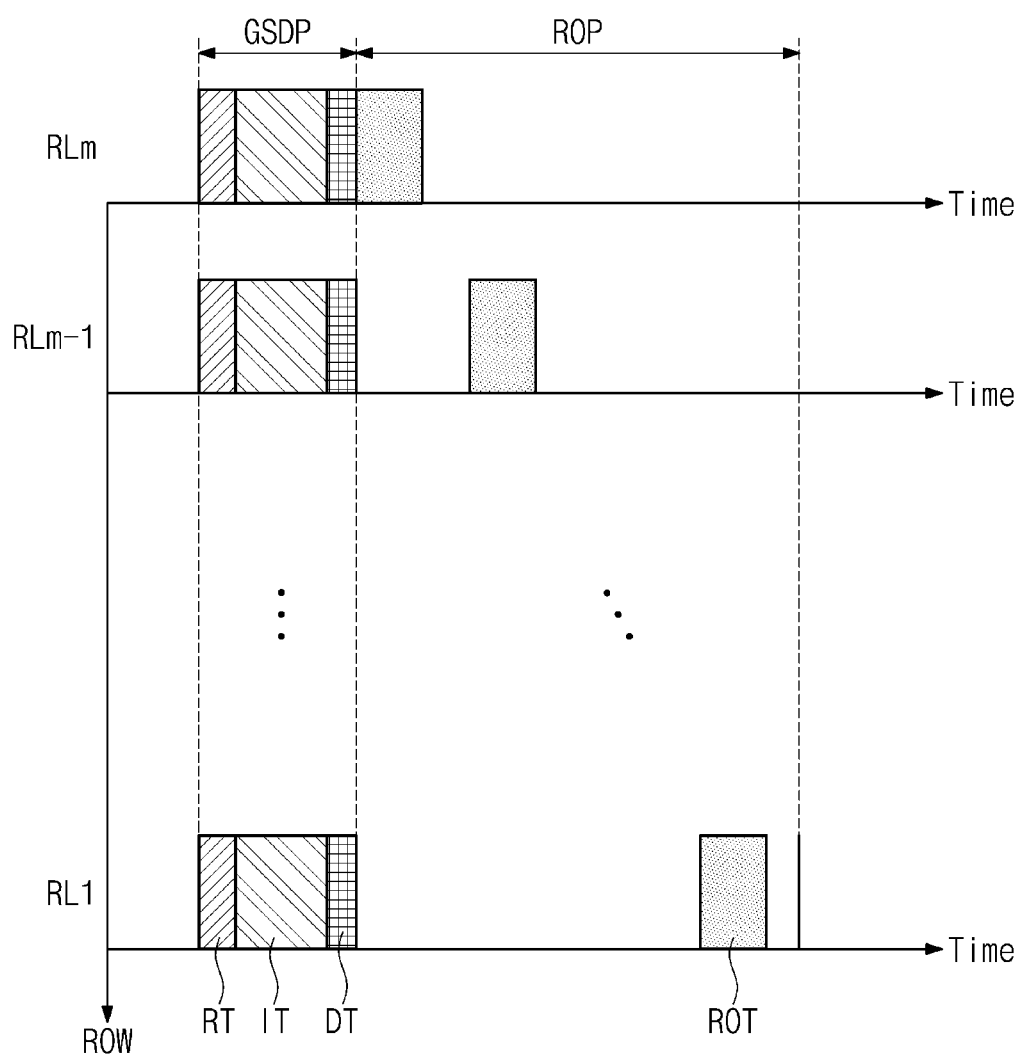
FIG. 2 is a diagram for describing an operation of an image sensor according to an embodiment of the present disclosure.

FIG. 2 is a diagram for describing an operation of the image sensor 100 according to an embodiment of the present disclosure. Referring to FIGS. 1 and 2, the image sensor 100 may be driven in a global shutter mode. In the global shutter mode, the image sensor 100 may perform a global signal dumping operation during a global signal dumping period GSDP and may perform a readout operation during a readout period ROP.

In the global signal dumping period GSDP, the image sensor 100 may reset a voltage of a floating diffusion node of each of the pixels PX during a reset time RT. In the global signal dumping period GSDP, during an integration time IT following the reset time RT, the image sensor 100 may integrate (e.g., accumulate) electrons at a photoelectric conversion element of each of the pixels PX, for example, a photo diode. In the global signal dumping period GSDP, during a dumping time DT following the integration time IT, the image sensor 100 may dump the electrons integrated at the photoelectric conversion element of each of the pixels PX, for example, the photo diode to the floating diffusion node.

In an embodiment, in the global signal dumping period GSDP, the image sensor 100 may control the pixels PX simultaneously equally. For example, the image sensor 100 may simultaneously reset the pixels PX connected to the first to m-th row lines RL1 to RLm, may simultaneously integrate electrons at the pixels PX connected to the first to m-th row lines RL1 to RLm, and may simultaneously dump the electrons integrated at the pixels PX connected to the first to m-th row lines RL1 to RLm to corresponding floating diffusion nodes. For example, the image sensor 100 may operate in the global shutter method.

In the readout period ROP, the image sensor 100 may sequentially select the first to m-th row lines RL1 to RLm. For example, the image sensor 100 may sequentially select the first to m-th row lines RL1 to RLm in a descending order from uppermost to lowermost row lines.

In the readout period ROP, during a readout time ROT corresponding to a row line selected from the first to m-th row lines RL1 to RLm, the image sensor 100 may read voltages corresponding to voltage levels of the floating diffusion nodes of the pixels PX connected to the selected row line through the first to n-th column lines CL1 to CLn. The image sensor 100 may sequentially select the first to m-th row lines RL1 to RLm and may read voltages corresponding to voltage levels of the floating diffusion nodes of the pixels PX connected to the selected row line. For example, the image sensor 100 may operate in the rolling readout method.

Figure 3:
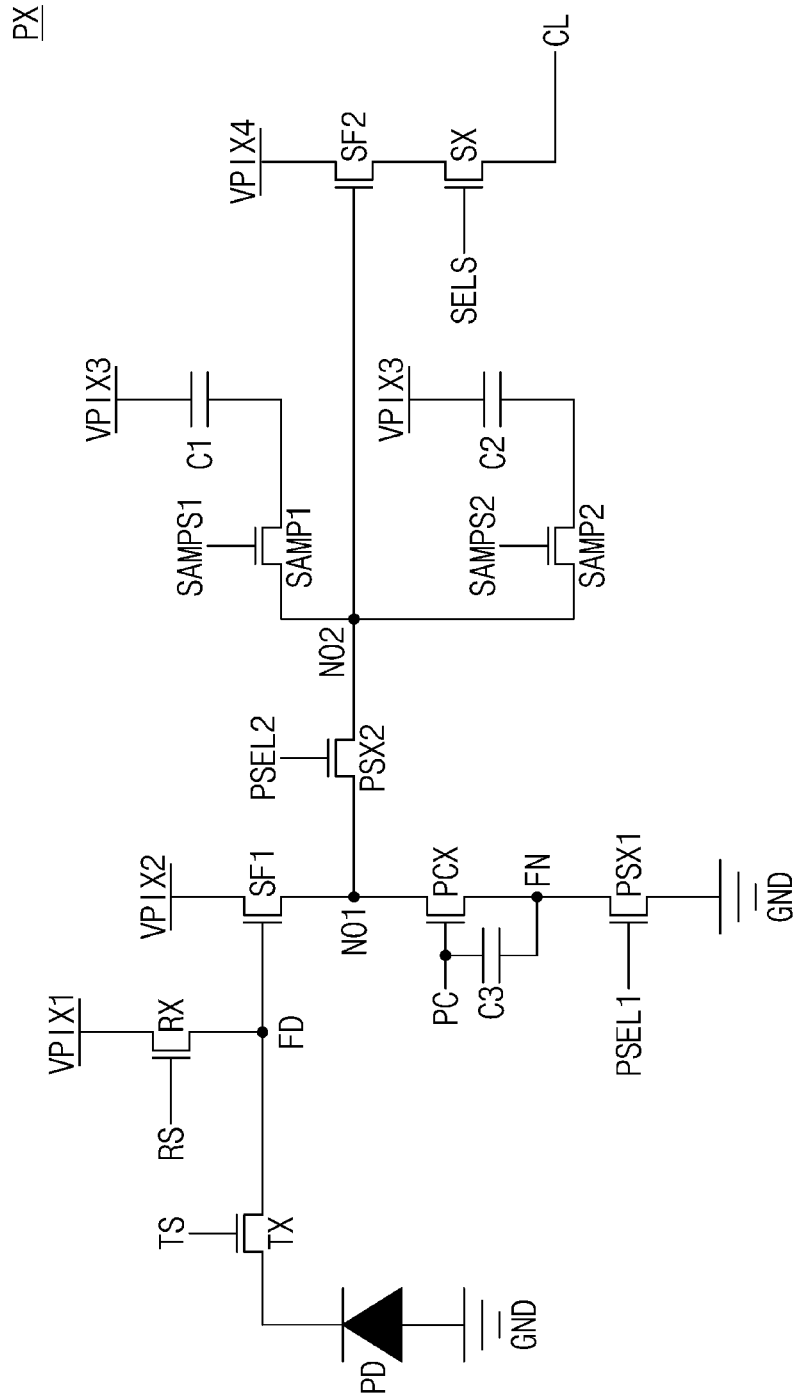
FIG. 3 illustrates an example of a pixel according to an embodiment of the present disclosure.

FIG. 3 illustrates an example, in the form of a circuit diagram, of a pixel PX according to an embodiment of the present disclosure. Referring to FIG. 3, the pixel PX of the image sensor 100 may include a photo diode PD, a transfer transistor TX, a reset transistor RX, a first source follower transistor SF1, a precharge transistor PCX, a first precharge select transistor PSX1, a second precharge select transistor PSX2, a first sampling transistor SAMP1, a first capacitor C1, a second sampling transistor SAMP2, a second capacitor C2, a second source follower transistor SF2, a select transistor SX, and a third capacitor C3.

The photo diode PD may be connected between a ground node to which a ground voltage GND is applied and a first terminal of the transfer transistor TX. The transfer transistor TX may include a gate to which a transfer control signal TS is applied, the first terminal connected to the photo diode PD, and a second terminal connected to a floating diffusion node FD. The transfer transistor TX may be turned on or turned off in response to the transfer control signal TS. When turned on by the transfer control signal TS, the transfer transistor TX may dump electrons generated by the photo diode PD to the floating diffusion node FD. Nodes or components described herein to which signals or voltages are applied are configured and connected to receive those signals or voltages.

The reset transistor RX may include a gate to which a reset control signal RS is applied, a first terminal connected to a first power node to which a first power supply voltage VPIX1 is applied, and a second terminal connected to the floating diffusion node FD. The reset transistor RX may be turned on or turned off in response to the reset control signal RS. When turned on by the reset control signal RS, the reset transistor RX may supply the first power supply voltage VPIX1 to the floating diffusion node FD and may reset the floating diffusion node FD.

The first source follower transistor SF1 may include a gate connected to the floating diffusion node FD, a first terminal connected to a second power node to which a second power supply voltage VPIX2 is applied, and a second terminal connected to a first node NO1. The second power supply voltage VPIX2 may be equal to or different from the first power supply voltage VPIX1. When the first source follower transistor SF1, the precharge transistor PCX, and the first precharge select transistor PSX1 are turned on, the first source follower transistor SF1 may operate as a source follower transistor that transfers a voltage change of the floating diffusion node FD, for example, a voltage change of the floating diffusion node FD due to the dumping of the transfer transistor TX to the first node NO1.

The precharge transistor PCX may include a gate to which a precharge control signal PC is applied, a first terminal connected to the first node NO1, and a second terminal connected to a floating node FN. The precharge transistor PCX may be turned on or turned off in response to the precharge control signal PC. When the first source follower transistor SF1, the precharge transistor PCX, and the first precharge select transistor PSX1 are turned on, the precharge transistor PCX may operate as a current source that allows the constant current to flow through the first source follower transistor SF1, the precharge transistor PCX, and the first precharge select transistor PSX1. As the constant current flows through the first source follower transistor SF1, the precharge transistor PCX, and the first precharge select transistor PSX1, the first source follower transistor SF1 may transfer the voltage change of the floating diffusion node FD to the first node NO1 without distortion or noise.

The first precharge select transistor PSX1 may include a gate to which a first precharge selection control signal PSEL1 is applied, a first terminal connected to the floating node FN, and a second terminal connected to the ground node to which the ground voltage GND is applied. The first precharge select transistor PSX1 may be turned on or turned off in response to the first precharge selection control signal PSEL1. The first precharge select transistor PSX1 may be used to form the current path through the first source follower transistor SF1, the precharge transistor PCX, and the first precharge select transistor PSX1 or to block the current path.

The second precharge select transistor PSX2 may include a gate to which a second precharge selection control signal PSEL2 is applied, a first terminal connected to the first node NO1, and a second terminal connected to a second node NO2. The second precharge select transistor PSX2 may be turned on or turned off in response to the second precharge selection control signal PSEL2. The second precharge select transistor PSX2 may be used to form or block the current path between the first node NO1 and the second node NO2.

The first capacitor C1 may be connected between a third power node to which a third power supply voltage VPIX3 is applied and a first terminal of the first sampling transistor SAMP1. The third power supply voltage VPIX3 may be equal to or different from the first power supply voltage VPIX1 or the second power supply voltage VPIX2. The first capacitor C1 may be used as a memory that stores the voltage level of the first node NO1 transferred through the second precharge select transistor PSX2 and the first sampling transistor SAMP1.

The first sampling transistor SAMP1 may include a gate to which a first sampling control signal SAMPS1 is applied, a first terminal connected to the first capacitor C1, and a second terminal connected to the second node NO2. The first sampling transistor SAMP1 may be turned on or turned off in response to the first sampling control signal SAMPS1. The first sampling transistor SAMP1 may be used to form or block the current path between the second node NO2 and the first capacitor C1.

The second capacitor C2 may be connected between the third power node to which the third power supply voltage VPIX3 is applied and a second terminal of the second sampling transistor SAMP2. The third power supply voltage VPIX3 may be equal to or different from the first power supply voltage VPIX1 or the second power supply voltage VPIX2. The second capacitor C2 may be used as a memory that stores the voltage level of the second node NO2 transferred through the second precharge select transistor PSX2 and the second sampling transistor SAMP2.

The second sampling transistor SAMP2 may include a gate to which a second sampling control signal SAMPS2 is applied, a first terminal connected to the second capacitor C2, and a second terminal connected to the second node NO2. The second sampling transistor SAMP2 may be turned on or turned off in response to the second sampling control signal SAMPS2. The second sampling transistor SAMP2 may be used to form or block the current path between the second node NO2 and the second capacitor C2.

The second source follower transistor SF2 may include a gate connected to the second node NO2, a first terminal applied a fourth power node to which a fourth power supply voltage VPIX4 is applied, and a second terminal connected to the select transistor SX. The fourth power supply voltage VPIX4 may be equal to or different from the first power supply voltage VPIX1, the second power supply voltage VPIX2, or the third power supply voltage VPIX3. When the second source follower transistor SF2 and the select transistor SX are turned on, the second source follower transistor SF2 may operate as a source follower transistor that transfers a change in the voltage level of the second node NO2 to a column line CL.

The select transistor SX may include a gate to which a selection control signal SELS is applied, a first terminal connected to the second terminal of the second source follower transistor SF2, and a second terminal connected to the column line CL. The select transistor SX may be turned on or turned off in response to the selection control signal SELS. The select transistor SX may be used to form or block the current path between the second source follower transistor SF2 and the column line CL.

The pixel PX may include a memory including the first capacitor C1 and the second capacitor C2. The intensity of light sensed by the photo diode PD, that is, the voltage change of the floating diffusion node FD may be stored in the first capacitor C1 or the second capacitor C2. The reset voltage level of the floating diffusion node FD may be stored in the first capacitor C1 or the second capacitor C2. Accordingly, while the pixels PX of one row output the voltage levels stored in the first capacitors C1 and the second capacitors C2 through the first to n-th column lines CL1 to CLn, pixels of another row may maintain the voltage levels stored in the first capacitors C1 and the second capacitors C2.

In an embodiment, the transfer control signal TS, the reset control signal RS, the precharge control signal PC, the first precharge selection control signal PSEL1, the second precharge selection control signal PSEL2, the first sampling control signal SAMPS1, the second sampling control signal SAMPS2, and the selection control signal SELS may be transferred to each pixel PX through sub-lines belonging to one row among the first to m-th row lines RL1 to RLm.

As a technology for manufacturing the pixels PX is improved, the size of the pixels PX may decrease. As the size of the pixels PX decreases, distances between the sub-lines transferring the transfer control signal TS, the reset control signal RS, the precharge control signal PC, the first precharge selection control signal PSEL1, the second precharge selection control signal PSEL2, the first sampling control signal SAMPS1, the second sampling control signal SAMPS2, and the selection control signal SELS may decrease, and thus, the coupling between the sub-lines may increase. When the coupling between the sub-lines increases, a voltage change of one sub-line may cause voltage changes of other sub-lines.

In an embodiment, the precharge transistor PCX may be designed such that the constant current flows when the first source follower transistor SF1, the precharge transistor PCX, and the first precharge select transistor PSX1 are turned on. However, when the voltage level of the precharge control signal PC or the voltage level of the floating node FN changes due to the voltage changes of other sub-lines, the amount of current flowing through the precharge transistor PCX may change. When the amount of current flowing through the precharge transistor PCX changes, noise may be caused when the first source follower transistor SF1 transfers a change in the voltage level of the floating diffusion node FD to the first node NO1. In this case, the image quality of image data generated by the pixels PX may be degraded.

The pixel PX of the image sensor 100 according to an embodiment of the present disclosure may further include the third capacitor C3 connected between the gate of the precharge transistor PCX and the floating node FN. The third capacitor C3 may maintain a voltage difference between the gate of the precharge transistor PCX and the floating node FN. For example, when the gate voltage of the precharge transistor PCX changes due to the coupling with another sub-line, the change in the gate voltage may be transferred to the floating node FN through the third capacitor C3. Accordingly, the voltage of the floating node FN may also change. In contrast, when the voltage of the floating node FN changes due to the coupling with another sub-line, the voltage change may be transferred to the gate of the precharge transistor PCX through the third capacitor C3. Accordingly, the gate voltage of the precharge transistor PCX may also change.

Therefore, even though the gate voltage of the precharge transistor PCX or the voltage of the floating node FN changes due to the coupling with other sub-lines, the voltage difference between the gate of the precharge transistor PCX and the floating node FN is maintained. Accordingly, a constant current may flow through the precharge transistor PCX.

The pixel PX of the image sensor 100 according to an embodiment of the present disclosure may maintain the voltage difference between the gate of the precharge transistor PCX and the floating node FN by providing the coupling (e.g., the third capacitor C3) greater than the coupling between sub-lines between the gate of the precharge transistor PCX and the floating node FN. Accordingly, the image quality of image data generated by the pixels PX may be prevented from being degraded.

Figure 4:
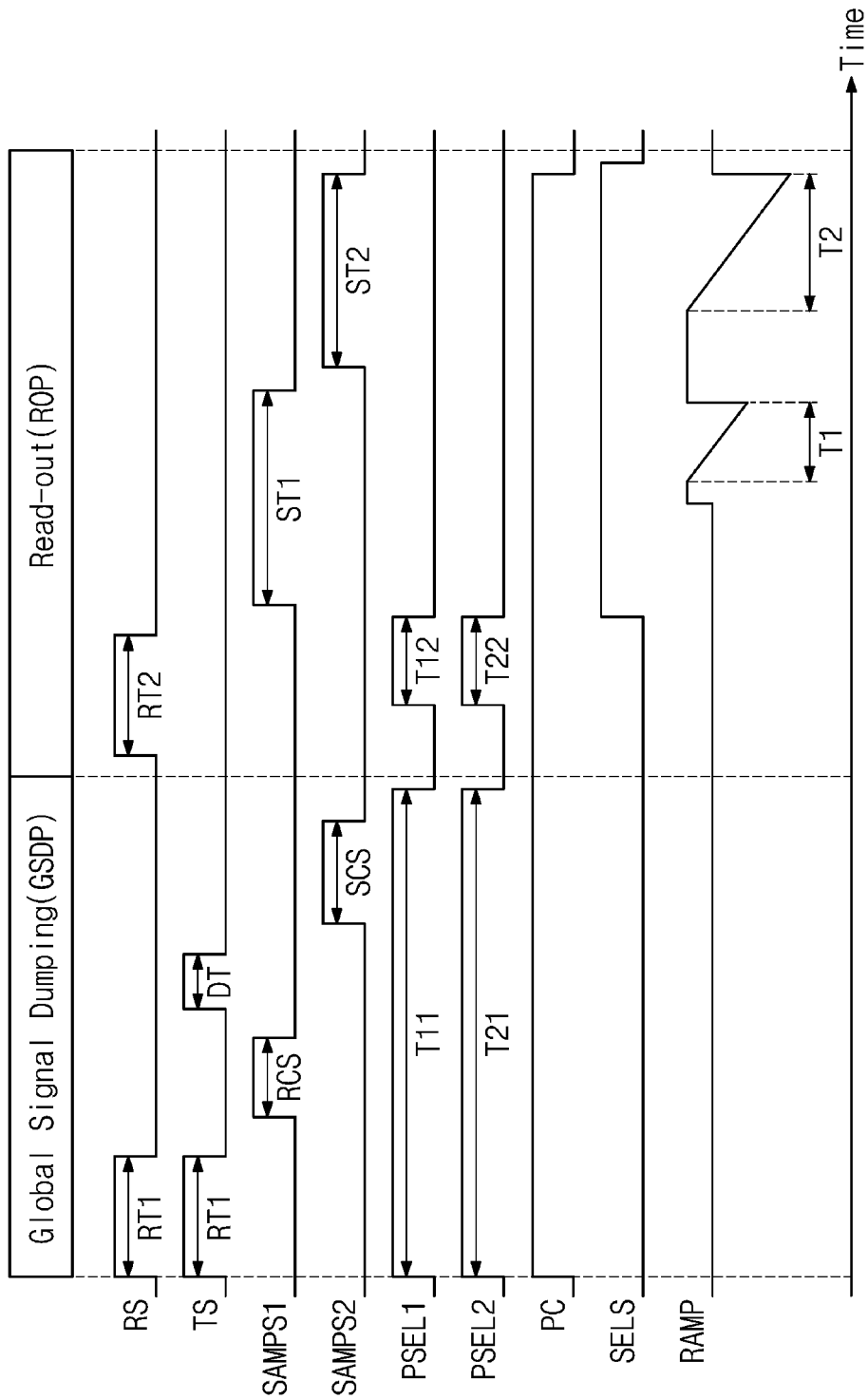
FIG. 4 illustrates an example of signals transferred to one pixel among pixels of an image sensor through sub-lines of a row line, according to an embodiment of the present disclosure.

FIG. 4 illustrates an example of signals transferred to one pixel among the pixels PX of the image sensor 100 through sub-lines of a row line, according to an embodiment of the present disclosure. Referring to FIGS. 3 and 4, the following operations will be performed in the global signal dumping period GSDP. The signals may be transferred from the row driver 120, and may be received or generated by the row driver based on signals from a controller which may be or may include the timing generator 160. The row driver 120 and/or a controller may be described herein as a control circuit.

The reset control signal RS may transition from the second level (e.g., the low level) to the first level (e.g., the high level) and may maintain the first level during a first reset time RT1. The different "times" described in connection with FIG. 4 and other timing diagrams, when used in the context of "during" a time, refer to a time period. A specific point in time may be referred to herein as a time point. Afterwards, the reset control signal RS may maintain the low level. As the reset transistor RX is turned on by the reset control signal RS of the high level, the floating diffusion node FD may be reset (i.e., the reset operation may be performed on the floating diffusion node FD). For example, the voltage of the floating diffusion node FD may be reset to the first power supply voltage VPIX1. In an embodiment, the first reset time RT1 may correspond to the reset time RT of FIG. 2.

The first source follower transistor SF1 may generate a voltage corresponding to the voltage level of the floating diffusion node FD at the first node NO1. The voltage of the first node NO1 may be transferred to the second node NO2 through the second precharge select transistor PSX2. As the reset control signal RS transitions to the high level, the floating diffusion node FD, the first node NO1, and the second node NO2 may be initialized.

The transfer control signal TS may transition from the second level (e.g., the low level) to the first level (e.g., the high level) and may maintain the first level during the first reset time RT1. Afterwards, the transfer control signal TS may maintain the low level. As the transfer transistor TX is turned on by the transfer control signal TS of the high level, photoelectrons integrated at the photo diode PD may be reset (i.e., the reset operation may be performed on the photo diode PD). For example, the photoelectrons integrated at the photo diode PD may be discharged to the first power node, to which the first power supply voltage VPIX1 is applied, through the transfer transistor TX and the reset transistor RX. In an embodiment, the first reset time RT1 may correspond to the reset time RT of FIG. 2.

After the reset control signal RS and the transfer control signal TS transition from the high level to the low level, the first sampling control signal SAMPS1 may transition from the low level to the high level. During a reset settling time RCS, the first sampling control signal SAMPS1 may maintain the high level. As the first sampling transistor SAMP1 is turned on by the first sampling control signal SAMPS1 of the high level, the voltage corresponding to the voltage level of the reset floating diffusion node FD (e.g., the voltage transferred through the first source follower transistor SF1) may be sampled by the first capacitor C1 (or the second capacitor C2) connected to the second node NO2.

After the first sampling control signal SAMPS1 transitions from the high level to the low level, the transfer control signal TS may transition from the low level to the high level. The transfer control signal TS may maintain the high level during the dumping time DT. As the transfer transistor TX is turned on by the transfer control signal TS of the high level, electrons integrated by the photo diode PD may be dumped to the floating diffusion node FD. As the electrons generated by the photo diode PD are dumped, the voltage of the floating diffusion node FD may gradually decrease from the first power supply voltage VPIX1. The first source follower transistor SF1 may amplify the change in the voltage of the floating diffusion node FD, for example, the decrease in the voltage level so as to be transferred to the first node NO1.

In an embodiment, a time from the high-to-low transition of the transfer control signal TS associated with the first reset time RT1 to the low-to-high transition of the transfer control signal TS associated with the dumping time DT may correspond to the integration time IT of FIG. 2.

After the transfer control signal TS transitions from the high level to the low level, the second sampling control signal SAMPS2 may transition from the low level to the high level. The second sampling control signal SAMPS2 may maintain the high level during a signal settling time SCS. As the second sampling transistor SAMP2 is turned on by the second sampling control signal SAMPS2 of the high level, the voltage of the floating diffusion node FD may be sampled by the second capacitor C2 connected to the second node NO2.

The first precharge selection control signal PSEL1 and the second precharge selection control signal PSEL2 may transition from the low level to the high level when the reset control signal RS and the transfer control signal TS transition from the low level to the high level. The first precharge selection control signal PSEL1 and the second precharge selection control signal PSEL2 may maintain the high level until the second sampling control signal SAMPS2 transitions from the high level to the low level. For example, the first precharge selection control signal PSEL1 may maintain the high level during a 11th time T11, and the second precharge selection control signal PSEL2 may maintain the high level during a 21st time T21. Labels "11" and "21" here are used merely to name different time periods, and are not necessarily used to indicate an ordinal value.

In an embodiment, the 11th time T11 of the first precharge selection control signal PSEL1 and the 21st time T21 of the second precharge selection control signal PSEL2 may overlap each other. For example, the 11th time T11 of the first precharge selection control signal PSEL1 and the 21st time T21 of the second precharge selection control signal PSEL2 may coincide with each other to have the same duration, the same start time point, and the same end time point, but the present disclosure is not limited thereto. Because the first precharge select transistor PSX1 and the second precharge select transistor PSX2 maintain the turn-on state, the voltage of the floating diffusion node FD may be sampled by the first capacitor C1 or the second capacitor C2 connected to the second node NO2.

The precharge control signal PC may transition from the low level to the high level before transitioning from the low level to the high level when the reset control signal RS and the transfer control signal TS transition from the low level to the high level. The precharge control signal PC may maintain the high level even after the second sampling control signal SAMPS2 transitions from the high level to the low level. The precharge transistor PCX may be turned on by the precharge control signal PC of the high level.

In the global signal dumping period GSDP, the selection control signal SELS may maintain the low level.

The following operations will be performed in the readout period ROP.

In the readout period ROP, the precharge control signal PC may maintain the high level. The reset control signal RS may maintain the high level during a second reset time RT2 after transitioning from the low level to the high level. The first precharge selection control signal PSEL1 and the second precharge selection control signal PSEL2 may transition from the low level to the high level. The first precharge selection control signal PSEL1 may maintain the high level during a 12th time T12. The second precharge selection control signal PSEL2 may maintain the high level during a 22nd time T22. In this case, the second reset time RT2, the 12th time T12 of the first precharge selection control signal PSEL1, and the 22nd time T22 of the second precharge selection control signal PSEL2 may overlap each other.

The second node NO2 may be reset by the reset control signal RS of the high level, the first precharge selection control signal PSEL1 of the high level, and the second precharge selection control signal PSEL2 of the high level. For example, the floating diffusion node FD may be reset with the first power supply voltage VPIX1, the first source follower transistor SF1 may generate a voltage corresponding to the voltage level of the floating diffusion node FD at the first node NO1. The voltage of the first node NO1 may be transferred to the second node NO2. That is, as the reset control signal RS transitions to the high level, the floating diffusion node FD, the first node NO1, and the second node NO2 may be initialized.

In an embodiment, the transfer control signal TS may maintain the low level during the second reset time RT2. Alternatively, in the readout period ROP, the transfer control signal TS may transition to the high level within a range of the second reset time RT2 and may then transition to the low level.

When the floating diffusion node FD, the first node NO1, and the second node NO2 are completely reset, the first sampling control signal SAMPS1 may transition from the low level to the high level. The first sampling control signal SAMPS1 may maintain the high level during a first settling time ST1. In this case, the selection control signal SELS may be at the high level within the first settling time ST1 in which the first sampling control signal SAMPS1 maintains the high level. The select transistor SX may be turned on by the selection control signal SELS of the high level, and the voltage sampled by the first capacitor C1 may be output to the corresponding column line CL.

After the select transistor SX is turned on, the ramp signal RAMP may decrease (or increase) with a given slope during a first time T1. During the first time T1 in which the voltage level of the ramp signal RAMP changes uniformly, the analog-to-digital conversion circuit 140 may generate a digital value corresponding to the voltage of the floating diffusion node FD by comparing the ramp signal RAMP and the signal of the column line CL.

After the first settling time ST1 passes and the first sampling control signal SAMPS1 transitions from the high level to the low level, the second sampling control signal SAMPS2 may transition from the low level to the high level. The second sampling control signal SAMPS2 may maintain the high level during a second settling time ST2. In this case, the selection control signal SELS may be at the high level within the second settling time ST2 in which the second sampling control signal SAMPS2 maintains the high level. The select transistor SX may be turned on by the selection control signal SELS of the high level, and the voltage sampled by the second capacitor C2 may be output to the corresponding column line CL.

After the select transistor SX is turned on, the ramp signal RAMP may decrease (or increase) with a given slope during a second time T2. During the second time T2 in which the voltage level of the ramp signal RAMP changes uniformly, the analog-to-digital conversion circuit 140 may generate a digital value corresponding to the voltage of the floating diffusion node FD by comparing the ramp signal RAMP and the signal of the column line CL.

The analog-to-digital conversion circuit 140 may obtain a digital value corresponding to the amount of electrons generated by the photo diode PD by subtracting the digital value obtained during the first time T1 from the digital value obtained during the second time T2. Therefore, the analog-to-digital conversion circuit 140 may obtain a digital value corresponding to brightness of the incident light.

An example of the readout period ROP in which the second sampling control signal SAMPS2 transitions from the low level to the high level after the first sampling control signal SAMPS1 transitions from the low level to the high level is illustrated in FIG. 4. However, the image sensor 100 according to embodiments of the present disclosure is not limited thereto. In the readout period ROP, the first sampling control signal SAMPS1 may transition from the low level to the high level after the second sampling control signal SAMPS2 transitions from the low level to the high level. That is, the pixel PX may output the voltage of the first capacitor C1 to the column line CL after outputting the voltage of the second capacitor C2 to the column line CL.

The operation of the global signal dumping period GSDP may be simultaneously performed with respect to the pixels PX connected to the first to m-th row lines RL1 to RLm. The operation of the readout period ROP may be sequentially performed with respect to the pixels PX connected to the first to m-th row lines RL1 to RLm.

For example, the operation of the readout period ROP illustrated in FIG. 4 may be simultaneously performed with respect to the pixels PX connected to the m-th row line RLm. Afterwards, the operation of the readout period ROP illustrated in FIG. 4 may be performed with respect to the pixels PX connected to the (m−1)-th row line RLm−1. The image sensor 100 may sequentially select the first to m-th row lines RL1 to RLm and may perform the operation of the readout period ROP with respect to the pixels PX connected to the selected row line.

As described with reference to FIG. 4, when voltages of sub-lines of a row line connected to one pixel PX change, the gate voltage of the precharge transistor PCX or the voltage of the floating node FN may change due to the coupling. The change in the gate voltage of the precharge transistor PCX or the voltage of the floating node FN may be transferred to the floating node FN or the gate of the precharge transistor PCX through the third capacitor C3. Accordingly, a difference between the gate voltage of the precharge transistor PCX and the voltage of the floating node FN may be uniformly maintained, and the constant current may flow through the precharge transistor PCX. Because the constant current flows through the precharge transistor PCX, the image quality of image data may be prevented from being degraded.

Figure 5:
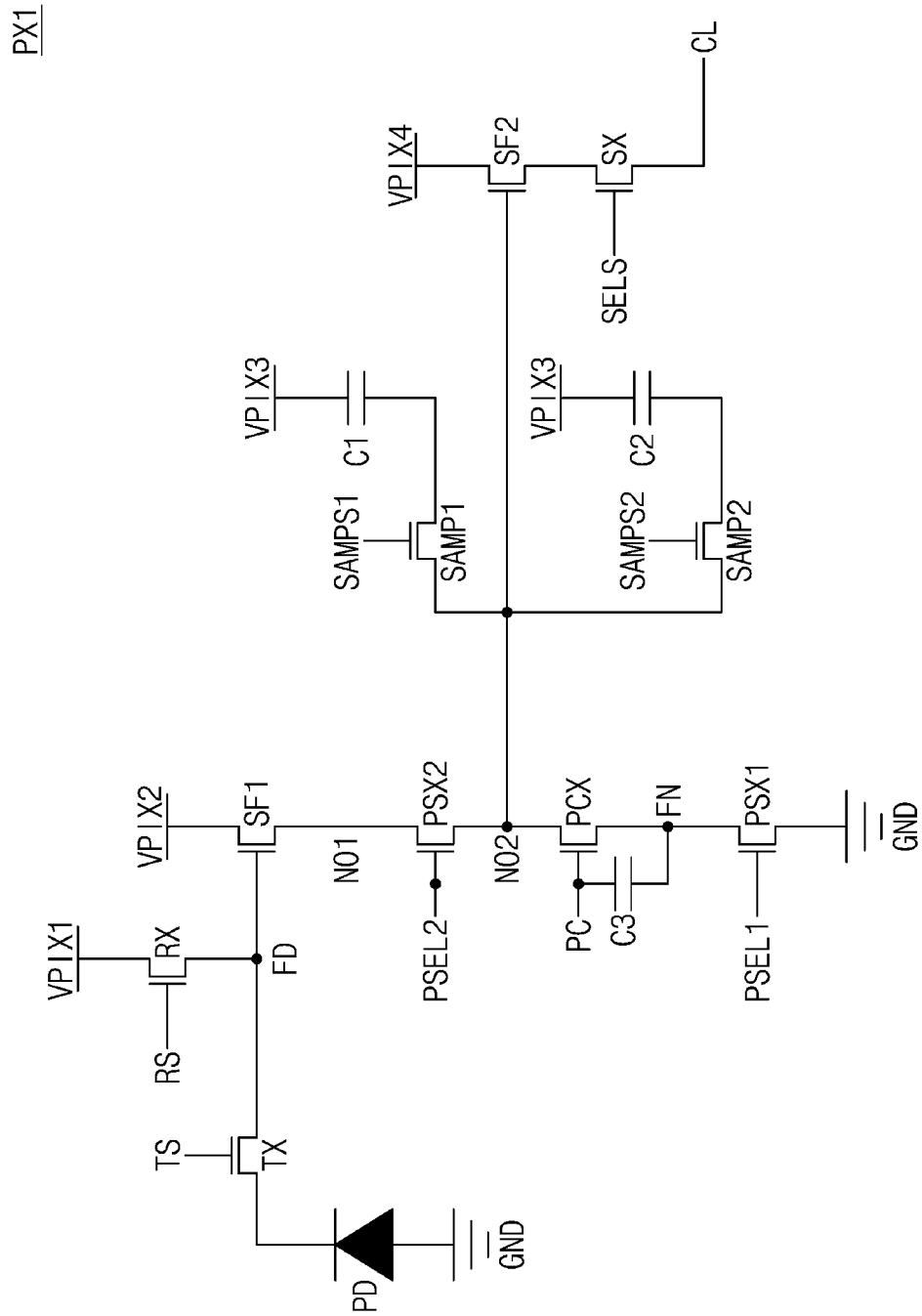
FIG. 5 illustrates an example of a pixel according to another embodiment of the present disclosure.

FIG. 5 illustrates an example of a pixel PX1 according to another embodiment of the present disclosure. Referring to FIG. 5, the pixel PX1 of the image sensor 100 may include the photo diode PD, the transfer transistor TX, the reset transistor RX, the first source follower transistor SF1, the precharge transistor PCX, the first precharge select transistor PSX1, the second precharge select transistor PSX2, the first sampling transistor SAMP1, the first capacitor C1, the second sampling transistor SAMP2, the second capacitor C2, the second source follower transistor SF2, the select transistor SX, and the third capacitor C3.

Configurations and operations of the photo diode PD, the transfer transistor TX, the reset transistor RX, the first source follower transistor SF1, the precharge transistor PCX, the first precharge select transistor PSX1, the second precharge select transistor PSX2, the first sampling transistor SAMP1, the first capacitor C1, the second sampling transistor SAMP2, the second capacitor C2, the second source follower transistor SF2, the select transistor SX, and the third capacitor C3 may be identical to those of the photo diode PD, the transfer transistor TX, the reset transistor RX, the first source follower transistor SF1, the precharge transistor PCX, the first precharge select transistor PSX1, the second precharge select transistor PSX2, the first sampling transistor SAMP1, the first capacitor C1, the second sampling transistor SAMP2, the second capacitor C2, the second source follower transistor SF2, the select transistor SX, and the third capacitor C3 described with reference to FIG. 3. Thus, additional description will be omitted to avoid redundancy.

The precharge transistor PCX may include the gate to which the precharge control signal PC is applied, the first terminal connected to the second node NO2, and the second terminal connected to the floating node FN. The second precharge select transistor PSX2 may include the gate to which the second precharge selection control signal PSEL2 is applied, the first terminal connected to the first node NO1, and the second terminal connected to the second node NO2.

The pixel PX1 may operate to be identical to that described with reference to FIGS. 3 and 4. The third capacitor C3 may be connected between the gate of the precharge transistor PCX and the floating node FN, and the constant current may flow through the precharge transistor PCX.

Figure 6:
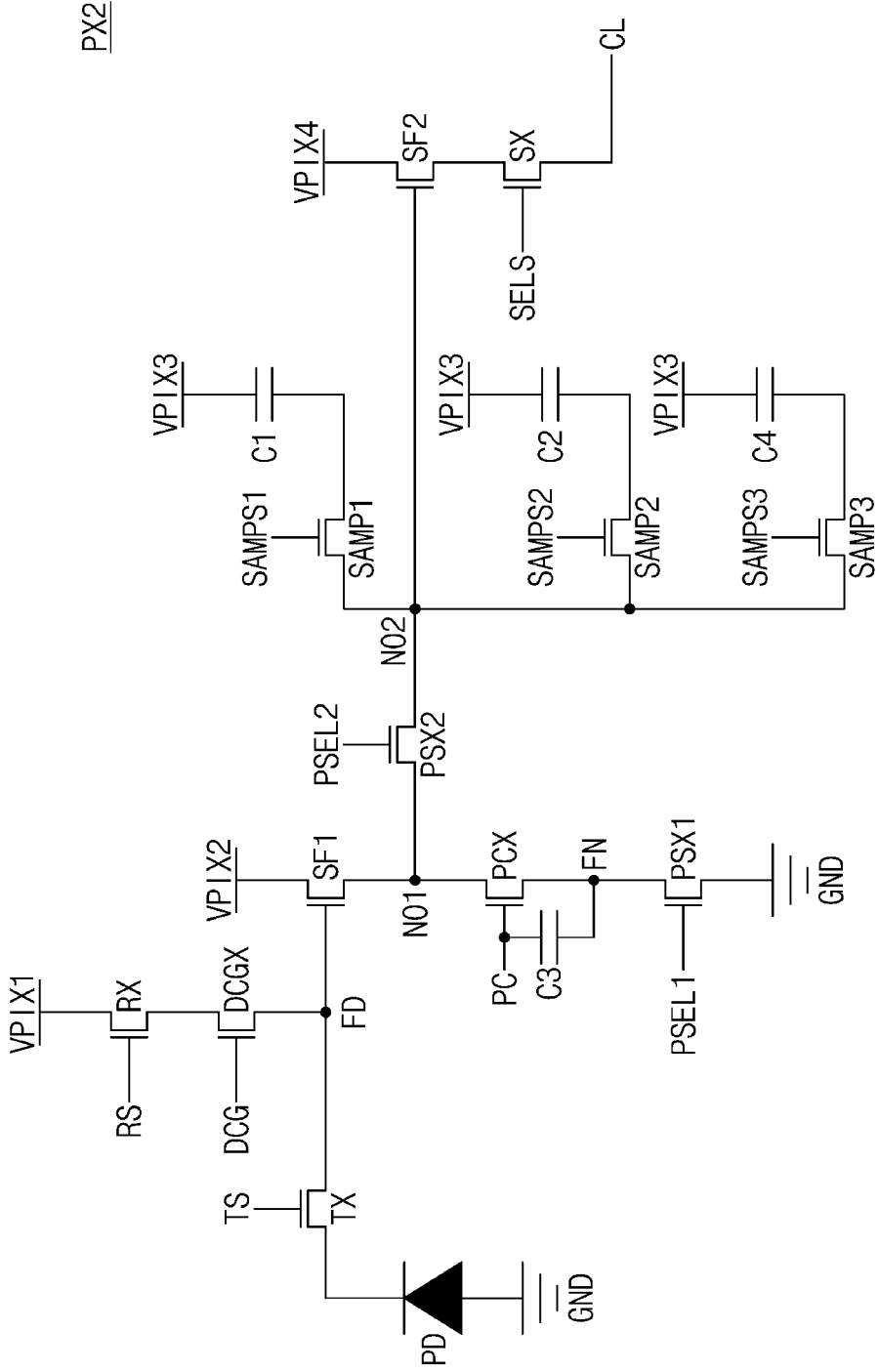
FIG. 6 illustrates an example of a pixel according to another embodiment of the present disclosure.

FIG. 6 illustrates an example of a pixel PX2 according to another embodiment of the present disclosure. Referring to FIG. 6, the pixel PX2 of the image sensor 100 may include the photo diode PD, the transfer transistor TX, the reset transistor RX, a dynamic conversion gain transistor DCGX, the first source follower transistor SF1, the precharge transistor PCX, the first precharge select transistor PSX1, the second precharge select transistor PSX2, the first sampling transistor SAMP1, the first capacitor C1, the second sampling transistor SAMP2, the second capacitor C2, the second source follower transistor SF2, the select transistor SX, the third capacitor C3, a third sampling transistor SAMP3, and a fourth capacitor C4.

Configurations and operations of the photo diode PD, the transfer transistor TX, the first source follower transistor SF1, the precharge transistor PCX, the first precharge select transistor PSX1, the second precharge select transistor PSX2, the first sampling transistor SAMP1, the first capacitor C1, the second sampling transistor SAMP2, the second capacitor C2, the second source follower transistor SF2, the select transistor SX, and the third capacitor C3 may be identical to those of the photo diode PD, the transfer transistor TX, the first source follower transistor SF1, the precharge transistor PCX, the first precharge select transistor PSX1, the second precharge select transistor PSX2, the first sampling transistor SAMP1, the first capacitor C1, the second sampling transistor SAMP2, the second capacitor C2, the second source follower transistor SF2, the select transistor SX, and the third capacitor C3 described with reference to FIG. 3. Thus, additional description will be omitted to avoid redundancy.

The reset transistor RX may include the gate to which the reset control signal RS is applied, the first terminal connected to the first power node to which the first power supply voltage VPIX1 is applied, and the second terminal connected to the dynamic conversion gain transistor DCGX.

The dynamic conversion gain transistor DCGX may include a gate to which a dynamic conversion gain control signal DCG is applied, a first terminal connected to the second terminal of the reset transistor RX, and a second terminal connected to the floating diffusion node FD. The dynamic conversion gain transistor DCGX may adjust a conversion gain with which the voltage of the floating diffusion node FD is changed by electrons of the photo diode PD, by adjusting the capacitance of the floating diffusion node FD.

The fourth capacitor C4 may be connected between the third power node to which the third power supply voltage VPIX3 is applied and the third sampling transistor SAMP3. The third sampling transistor SAMP3 may include a gate to which a third sampling control signal SAMPS3 is applied, a first terminal connected to the fourth capacitor C4, and a second terminal connected to the second node NO2.

Each of the first capacitor C1, the second capacitor C2, and the fourth capacitor C4 may store one of a voltage corresponding to a reset level of the floating diffusion node FD, a voltage corresponding to a signal level of the floating diffusion node FD when the dynamic conversion gain transistor DCGX is turned on, and a voltage corresponding to a signal level of the floating diffusion node FD when the dynamic conversion gain transistor DCGX is turned off.

In an embodiment, a connection relationship between the first source follower transistor SF1, the precharge transistor PCX, and the second precharge select transistor PSX2 of the pixel PX2 may be identical to that of the pixel PX1 of FIG. 5.

Figure 7:
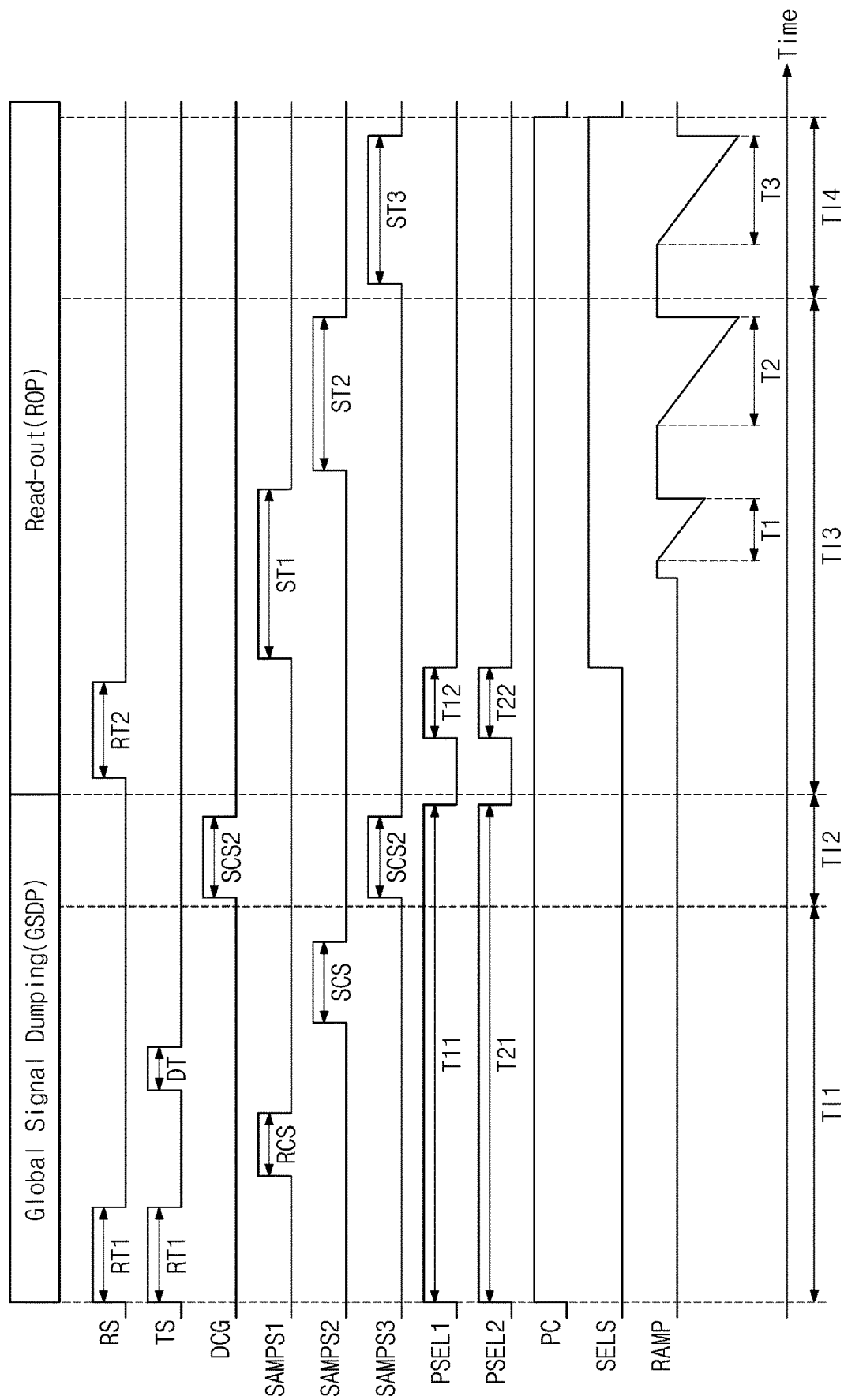
FIG. 7 illustrates an example of signals transferred to a pixel of an image sensor through sub-lines of a row line, according to an embodiment of the present disclosure.

FIG. 7 illustrates an example of signals transferred to the pixels PX2 of the image sensor 100 through sub-lines of a row line, according to an embodiment of the present disclosure. Referring to FIGS. 6 and 7, the following operations will be performed in the global signal dumping period GSDP.

The global signal dumping period GSDP may include a first time period TI1 and a second time period TI2. In the first time period TI1, the reset control signal RS, the transfer control signal TS, the first sampling control signal SAMPS1, the second sampling control signal SAMPS2, the first precharge selection control signal PSEL1, the second precharge selection control signal PSEL2, the precharge control signal PC, the selection control signal SELS, and the ramp signal RAMP may be controlled to be identical to those of the global signal dumping period GSDP of FIG. 4. In the first time period TI1, the third sampling control signal SAMPS3 may maintain the low level. In first time period TI1, the dynamic conversion gain control signal DCG may maintain the low level.

In the beginning of the second time period TI2, the reset control signal RS, the transfer control signal TS, the first sampling control signal SAMPS1, the second sampling control signal SAMPS2, the first precharge selection control signal PSEL1, the second precharge selection control signal PSEL2, the precharge control signal PC, the selection control signal SELS, and the ramp signal RAMP may maintain previous levels.

In the second time period TI2, after the dynamic conversion gain control signal DCG transitions from the low level to the high level, the dynamic conversion gain control signal DCG may maintain the high level during a second signal settling time SCS2. When the dynamic conversion gain control signal DCG transitions from the low level to the high level, the dynamic conversion gain transistor DCGX may be turned on. Accordingly, the capacitance of the floating diffusion node FD may increase, and the voltage of the floating diffusion node FD may decrease. The first source follower transistor SF1 may transfer a change in the voltage of the floating diffusion node FD to the first node NO1. Accordingly, the voltage of the first node NO1 may also decrease.

In the second time period TI2, after the third sampling control signal SAMPS3 transitions from the low level to the high level, the third sampling control signal SAMPS3 may maintain the high level during the second signal settling time SCS2. When the third sampling control signal SAMPS3 transitions from the low level to the high level, the third sampling transistor SAMP3 may be turned on. The voltage of the first node NO1 may be stored in the fourth capacitor C4 through the second precharge select transistor PSX2 and the third sampling transistor SAMP3.

During the reset settling time RCS, the voltage corresponding to the reset level of the floating diffusion node FD may be stored in the first capacitor C1. During the signal settling time SCS, the voltage corresponding to the voltage level of the floating diffusion node FD corresponding to the high conversion gain (HCG) may be stored in the second capacitor C2. During the second signal settling time SCS2, the voltage corresponding to the voltage level of the floating diffusion node FD corresponding to the low conversion gain (LCG) may be stored in the fourth capacitor C4.

After the third sampling control signal SAMPS3 and the dynamic conversion gain control signal DCG transition from the high level to the low level, the first precharge selection control signal PSEL1 and the second precharge selection control signal PSEL2 may transition from the high level to the low level.

The readout period ROP may include a third time period TI3 and a fourth time period TI4. In the third time period TI3, the reset control signal RS, the transfer control signal TS, the first sampling control signal SAMPS1, the second sampling control signal SAMPS2, the first precharge selection control signal PSEL1, the second precharge selection control signal PSEL2, the precharge control signal PC, and the selection control signal SELS may be controlled to be identical to those of the readout period ROP of FIG. 4. The ramp signal RAMP may increase to a level higher than that of the ramp signal RAMP of FIG. 4.

In the third time period TI3, the third sampling control signal SAMPS3 may maintain the low level. In the third time period TI3, the dynamic conversion gain control signal DCG may maintain the low level.

In the beginning of the fourth time period TI4, the reset control signal RS, the transfer control signal TS, the first sampling control signal SAMPS1, the second sampling control signal SAMPS2, the first precharge selection control signal PSEL1, the second precharge selection control signal PSEL2, the precharge control signal PC, the selection control signal SELS, and the ramp signal RAMP may maintain previous levels.

In the fourth time period TI4, after the third sampling control signal SAMPS3 transitions from the low level to the high level, the third sampling control signal SAMPS3 may maintain the high level during a third settling time ST3. When the third sampling control signal SAMPS3 is at the high level, the third sampling transistor SAMP3 may be turned on. When the third sampling transistor SAMP3 is turned on, the voltage stored in the fourth capacitor C4 may be transferred to the second node NO2. The second source follower transistor SF2 and the select transistor SX may output a voltage corresponding to a level of the voltage of the second node NO2 to the corresponding column line CL.

After the third sampling control signal SAMPS3 transitions from the low level to the high level, the ramp signal RAMP may gradually decrease (or increase). The analog-to-digital conversion circuit 140 may generate a digital value corresponding to the voltage level of the floating diffusion node FD by comparing the voltage level of the column line CL and the ramp signal RAMP.

During the first settling time ST1, the pixel PX2 may output the voltage corresponding to the reset level of the floating diffusion node FD to the column line CL by using the first capacitor C1. During the second settling time ST2, the pixel PX2 may output the voltage corresponding to the high conversion gain signal level of the floating diffusion node FD to the column line CL by using the second capacitor C2. During the third settling time ST3, the pixel PX2 may output the voltage corresponding to the low conversion gain signal level to the column line CL by using the fourth capacitor C4.

As described with reference to FIG. 7, when voltages of sub-lines of a row line connected to one pixel PX change, the gate voltage of the precharge transistor PCX or the voltage of the floating node FN may change due to the coupling. The change in the gate voltage of the precharge transistor PCX or the voltage of the floating node FN may be transferred to the floating node FN or the gate of the precharge transistor PCX through the third capacitor C3. Accordingly, a difference between the gate voltage of the precharge transistor PCX and the voltage of the floating node FN may be uniformly maintained, and the constant current may flow through the precharge transistor PCX. Because the constant current flows through the precharge transistor PCX, the image quality of image data may be prevented from being degraded.

Figure 8:
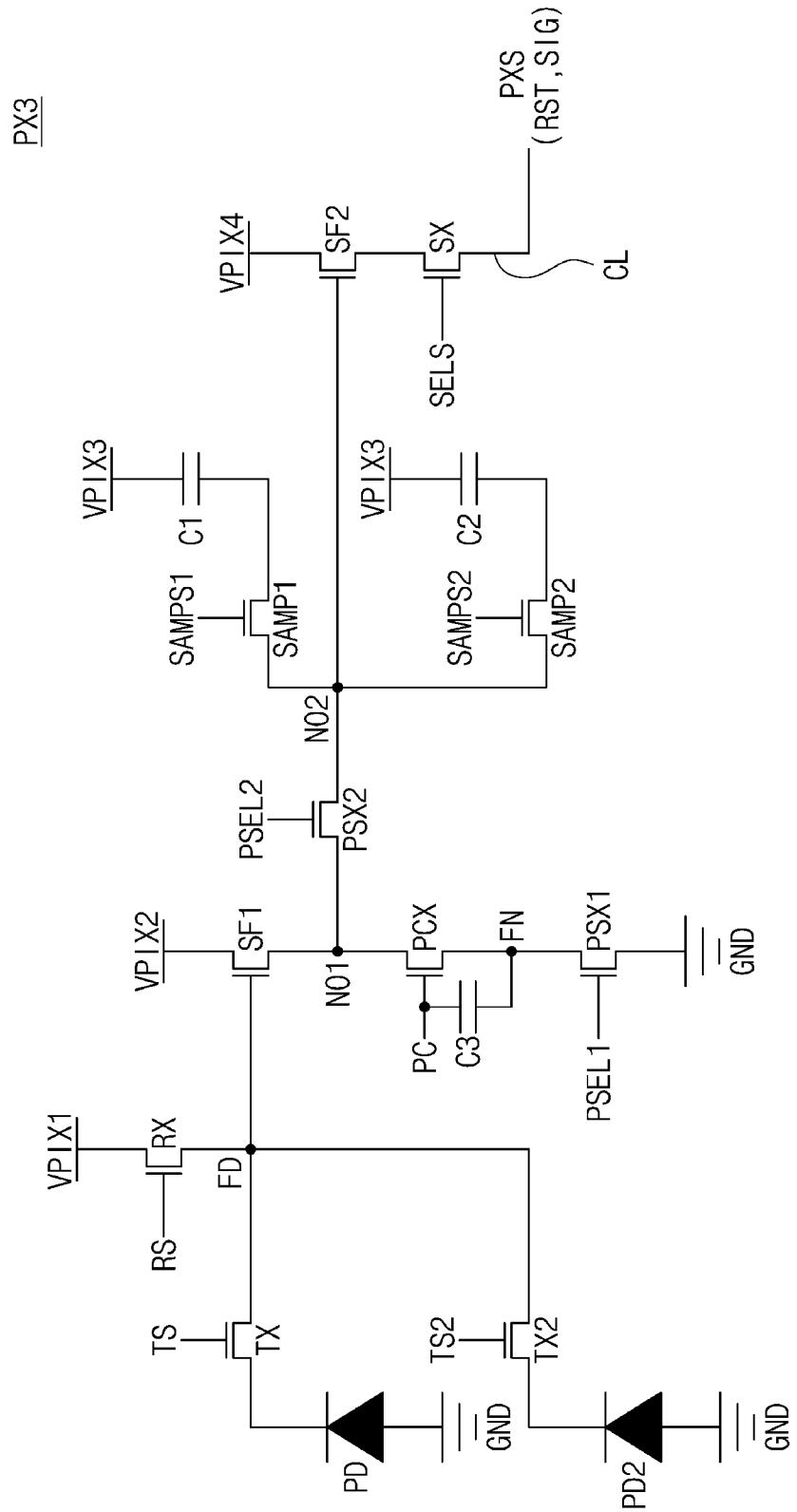
FIG. 8 illustrates an example of a pixel according to another embodiment of the present disclosure.

FIG. 8 illustrates an example of a pixel PX3 according to another embodiment of the present disclosure. Referring to FIG. 8, the pixel PX3 of the image sensor 100 may include the photo diode PD, the transfer transistor TX, a second photo diode PD2, a second transfer transistor TX2, the reset transistor RX, the first source follower transistor SF1, the precharge transistor PCX, the first precharge select transistor PSX1, the second precharge select transistor PSX2, the first sampling transistor SAMP1, the first capacitor C1, the second sampling transistor SAMP2, the second capacitor C2, the second source follower transistor SF2, the select transistor SX, and the third capacitor C3. Compared to the pixel PX of FIG. 3, the pixel PX3 of FIG. 8 may further include the second photo diode PD2 and the second transfer transistor TX2.

The second photo diode PD2 may be connected between the second transfer transistor TX2 and the ground node to which the ground voltage GND is applied. The second transfer transistor TX2 may include a gate to which a second transfer control signal TS2 is applied, a first terminal connected to the second photo diode PD2, and a second terminal connected to the floating diffusion node FD. The second transfer transistor TX2 may be turned on or turned off in response to the second transfer control signal TS2. When turned on by the second transfer control signal TS2, the second transfer transistor TX2 may dump electrons generated by the second photo diode PD2 to the floating diffusion node FD.

In an embodiment, during the signal settling time SCS described with reference to FIG. 4, the image sensor 100 may dump the electrons generated by the photo diode PD of the pixel PX3 to the floating diffusion node FD through the transfer transistor TX. Alternatively, the image sensor 100 may dump the electrons generated by the second photo diode PD2 and the second transfer transistor TX2 of the pixel PX3 to the floating diffusion node FD through the transfer transistor TX and the second transfer transistor TX2.

For example, when the average illuminance of image data generated by the pixels PX3 is higher than a first threshold value, the image sensor 100 may dump only the electrons generated by the photo diode PD to the floating diffusion node FD. When the average illuminance of image data generated by the pixels PX3 is lower than a second threshold value, the image sensor 100 may dump the electrons generated by the photo diode PD and the second photo diode PD2 to the floating diffusion node FD. The first threshold value may be greater than the second threshold value.

In an embodiment, a connection relationship between the first source follower transistor SF1, the precharge transistor PCX, and the second precharge select transistor PSX2 of the pixel PX3 may be identical to that of the pixel PX1 of FIG. 5.

In an embodiment, like the pixel PX2 of FIG. 6, the dynamic conversion gain transistor DCGX may be added between the reset transistor RX and the floating diffusion node FD of the pixel PX3. Also, the fourth capacitor C4 and the third sampling transistor SAMP3 may be added between the power node to which the third power supply voltage VPIX3 is applied and the second node NO2.

Figure 9:
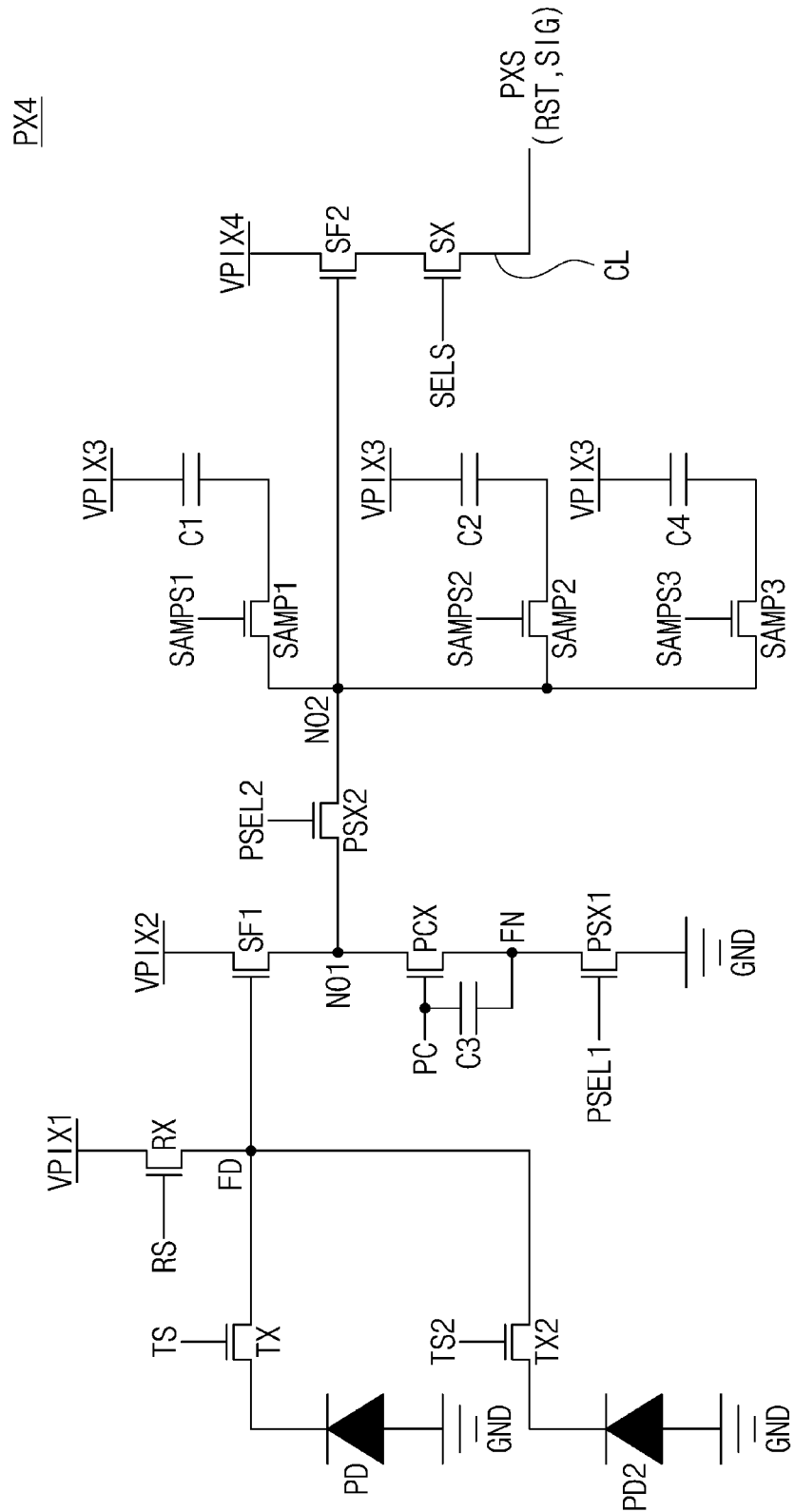
FIG. 9 illustrates an example of a pixel according to another embodiment of the present disclosure.

FIG. 9 illustrates an example of a pixel PX4 according to another embodiment of the present disclosure. Referring to FIG. 9, the pixel PX4 of the image sensor 100 may include the photo diode PD, the transfer transistor TX, the second photo diode PD2, the second transfer transistor TX2, the reset transistor RX, the first source follower transistor SF1, the precharge transistor PCX, the first precharge select transistor PSX1, the second precharge select transistor PSX2, the first sampling transistor SAMP1, the first capacitor C1, the second sampling transistor SAMP2, the second capacitor C2, the fourth capacitor C4, the third sampling transistor SAMP3, the second source follower transistor SF2, the select transistor SX, and the third capacitor C3. Compared to the pixel PX3 of FIG. 8, the pixel PX4 of FIG. 9 may further include the fourth capacitor C4 and the third sampling transistor SAMP3.

The fourth capacitor C4 may be connected between the third power node to which the third power supply voltage VPIX3 is applied and the third sampling transistor SAMP3. The third sampling transistor SAMP3 may include the gate to which the third sampling control signal SAMPS3 is applied, the first terminal connected to the fourth capacitor C4, and the second terminal connected to the second node NO2.

As described with reference to FIG. 7, the image sensor 100 may have three signal settling times in the global signal dumping period GSDP when generating image data by using the pixel PX4. During the first signal settling time, the voltage corresponding to the reset level of the floating diffusion node FD may be stored in the first capacitor C1. During the second signal settling time, the electrons generated by the photo diode PD may be dumped to the floating diffusion node FD, and a voltage corresponding to a first signal level of the floating diffusion node FD may be stored in the second capacitor C2. During the third signal settling time, the electrons generated by the second photo diode PD2 may be dumped to the floating diffusion node FD, and a voltage corresponding to a second signal level of the floating diffusion node FD may be stored in the fourth capacitor C4.

As described with reference to FIG. 7, the image sensor 100 may have three settling times in the readout period ROP when generating image data by using the pixel PX4. During the first settling time, the pixel PX4 may output the voltage corresponding to the reset level of the floating diffusion node FD to the column line CL by using the first capacitor C1. During the second settling time, the pixel PX4 may output the voltage corresponding to the first signal level of the floating diffusion node FD to the column line CL by using the second capacitor C2. During the third settling time, the pixel PX4 may output the voltage corresponding to the second signal level of the floating diffusion node FD to the column line CL by using the fourth capacitor C4.

The analog-to-digital conversion circuit 140 may convert the voltages output from the pixel PX4 into digital values. The image sensor 100 may obtain a first digital value corresponding to the intensity of light incident onto the photo diode PD by subtracting the digital value obtained during the first settling time from the digital value obtained during the second settling time. The image sensor 100 may obtain a second digital value corresponding to the intensity of light incident onto the second photo diode PD2 by subtracting the digital value obtained during the first settling time and the digital value obtained during the second settling time from the digital value obtained during the third settling time. The first digital value and the second digital value may be used for auto-focusing.

In an embodiment, a connection relationship between the first source follower transistor SF1, the precharge transistor PCX, and the second precharge select transistor PSX2 of the pixel PX4 may be identical to that of the pixel PX1 of FIG. 5.

Figure 10:
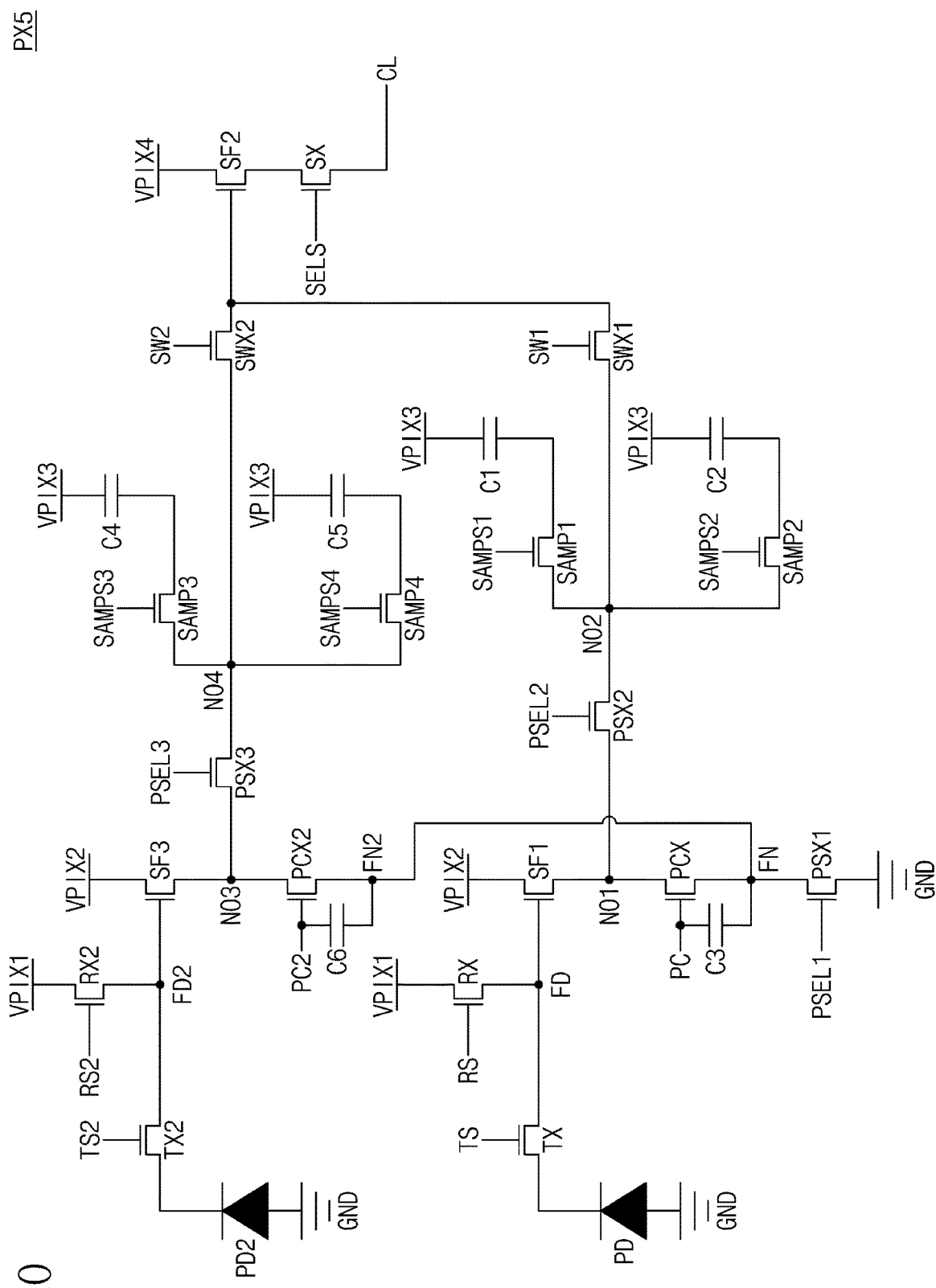
FIG. 10 illustrates an example of a pixel according to another embodiment of the present disclosure.

FIG. 10 illustrates an example of a pixel PX5 according to another embodiment of the present disclosure. Referring to FIG. 10, the pixel PX5 of the image sensor 100 may include the photo diode PD, the transfer transistor TX, the reset transistor RX, the first source follower transistor SF1, the precharge transistor PCX, the first precharge select transistor PSX1, the second precharge select transistor PSX2, the first sampling transistor SAMP1, the first capacitor C1, the second sampling transistor SAMP2, the second capacitor C2, the second source follower transistor SF2, the select transistor SX, the third capacitor C3, the second photo diode PD2, the second transfer transistor TX2, a second reset transistor RX2, a third source follower transistor SF3, a second precharge transistor PCX2, a third precharge select transistor PSX3, the fourth capacitor C4, the third sampling transistor SAMP3, a fifth capacitor C5, a fourth sampling transistor SAMP4, a first switch transistor SWX1, and a second switch transistor SWX2.

Compared to the pixel PX of FIG. 1, the pixel PX5 may further include the second photo diode PD2, the second transfer transistor TX2, the second reset transistor RX2, the third source follower transistor SF3, the second precharge transistor PCX2, the third precharge select transistor PSX3, the fourth capacitor C4, the third sampling transistor SAMP3, the fifth capacitor C5, the fourth sampling transistor SAMP4, the first switch transistor SWX1, and the second switch transistor SWX2.

The second photo diode PD2 may be connected between the ground node to which the ground voltage GND is applied and the second transfer transistor TX2. The second transfer transistor TX2 may include a gate to which the second transfer control signal TS2 is applied, a first terminal connected to the second photo diode PD2, and a second terminal connected to a second floating diffusion node FD2. The second transfer transistor TX2 may operate to be similar to the transfer transistor TX.

The second reset transistor RX2 may include a gate to which a second reset control signal RS2 is applied, a first terminal connected to the first power node to which the first power supply voltage VPIX1 is applied, and a second terminal connected to the second floating diffusion node FD2. The second reset transistor RX2 may operate to be similar to the reset transistor RX.

The third source follower transistor SF3 may include a gate connected to the second floating diffusion node FD2, a first terminal connected to the second power node to which the second power supply voltage VPIX2 is applied, and a second terminal connected to a third node NO3. The third source follower transistor SF3 may operate to be similar to the first source follower transistor SF1.

The second precharge transistor PCX2 may include a gate to which a second precharge control signal PC2 is applied, a first terminal connected to the third node NO3, and a second terminal connected to the second floating node FN2. The second precharge transistor PCX2 may operate to be similar to the precharge transistor PCX.

The third precharge select transistor PSX3 may include a gate to which a third precharge selection control signal PSEL3 is applied, a first terminal connected to the third node NO3, and a second terminal connected to a fourth node NO4. The third precharge select transistor PSX3 may operate to be similar to the second precharge select transistor PSX2.

The fourth capacitor C4 may be connected between the third power node to which the third power supply voltage VPIX3 is applied and a first terminal of the third sampling transistor SAMP3. The third sampling transistor SAMP3 may include a gate to which the third sampling control signal SAMPS3 is applied, the first terminal connected to the fourth capacitor C4, and a second terminal connected to the fourth node NO4. The third sampling transistor SAMP3 may operate to be similar to the first sampling transistor SAMP1.

The fifth capacitor C5 may be connected between the third power node to which the third power supply voltage VPIX3 is applied and a first terminal of the fourth sampling transistor SAMP4. The fourth sampling transistor SAMP4 may include a gate to which a fourth sampling control signal SAMPS4 is applied, the first terminal connected to the fifth capacitor C5, and a second terminal connected to the fourth node NO4. The fourth sampling transistor SAMP4 may operate to be similar to the second sampling transistor SAMP2.

The first switch transistor SWX1 may include a gate to which a first switch control signal SW1 is applied, a first terminal connected to the second node NO2, and a second terminal connected to the gate of the second source follower transistor SF2. The first switch transistor SWX1 may form or block the current path between the second node NO2 and the gate of the second source follower transistor SF2.

The second switch transistor SWX2 may include a gate to which a second switch control signal SW2 is applied, a first terminal connected to the fourth node NO4, and a second terminal connected to the gate of the second source follower transistor SF2. The second switch transistor SWX2 may form or block the current path between the fourth node NO4 and the gate of the second source follower transistor SF2.

A sixth capacitor C6 may be connected between the gate of the second precharge transistor PCX2 and the floating node FN. The sixth capacitor C6 may allow the constant current to flow through the second precharge transistor PCX2.

As described with reference to FIGS. 3 and 4, the voltage corresponding to the reset level of the floating diffusion node FD and the voltage corresponding to the signal level of the floating diffusion node FD may be respectively stored in the first capacitor C1 and the second capacitor C2. As in the above description, a voltage corresponding to a reset level of the second floating diffusion node FD2 and a voltage corresponding to a signal level of the second floating diffusion node FD2 may be respectively stored in the fourth capacitor C4 and the fifth capacitor C5.

The image sensor 100 may sequentially turn on and turn off the first switch transistor SWX1 and the second switch transistor SWX2 such that the voltages corresponding to the reset level and the signal level of the floating diffusion node FD are output to the column line CL and the voltages corresponding to the reset level and the signal level of the second floating diffusion node FD2 are output to the column line CL.

In an embodiment, a connection relationship between the first source follower transistor SF1, the precharge transistor PCX, and the second precharge select transistor PSX2 of the pixel PX5 may be identical to that of the pixel PX1 of FIG. 5. Also, a connection relationship between the third source follower transistor SF3, the second precharge transistor PCX2, and the third precharge select transistor PSX3 of the pixel PX5 may be identical to that of the pixel PX1 of FIG. 5.

In an embodiment, like the pixel PX2 of FIG. 6, a dynamic conversion gain transistor may be added between the reset transistor RX and the floating diffusion node FD of the pixel PX5. Also, an additional capacitor and an additional sampling transistor may be provided between the power node to which the third power supply voltage VPIX3 is applied and the second node NO2.

Likewise, a dynamic conversion gain transistor may be added between the second reset transistor RX2 and the second floating diffusion node FD2 of the pixel PX5. Also, an additional capacitor and an additional sampling transistor may be provided between the power node to which the third power supply voltage VPIX3 is applied and the fourth node NO4.

In an embodiment, as described with reference to FIGS. 8 and 9, two or more photo diodes and two or more transfer transistors may be connected to the floating diffusion node FD. Likewise, two or more photo diodes and two or more transfer transistors may be connected to the second floating diffusion node FD2.

As described with reference to FIG. 8, depending on the average illuminance, the electrons generated by some or all of the two or more photo diodes may be dumped to the floating diffusion node FD. Likewise, depending on the average illuminance, the electrons generated by some or all of the two or more photo diodes may be dumped to the second floating diffusion node FD2.

As described with reference to FIG. 9, the signal level of the floating diffusion node FD may be sampled when the electrons generated by some of the two or more photo diodes are dumped to the floating diffusion node FD, and the signal level of the floating diffusion node FD may be sampled when the electrons generated by all of the two or more photo diodes are dumped to the floating diffusion node FD. Likewise, the signal level of the second floating diffusion node FD2 may be sampled when the electrons generated by some of the two or more photo diodes are dumped to the second floating diffusion node FD2, and the signal level of the second floating diffusion node FD2 may be sampled when the electrons generated by all of the two or more photo diodes are dumped to the second floating diffusion node FD2.

Figure 11:
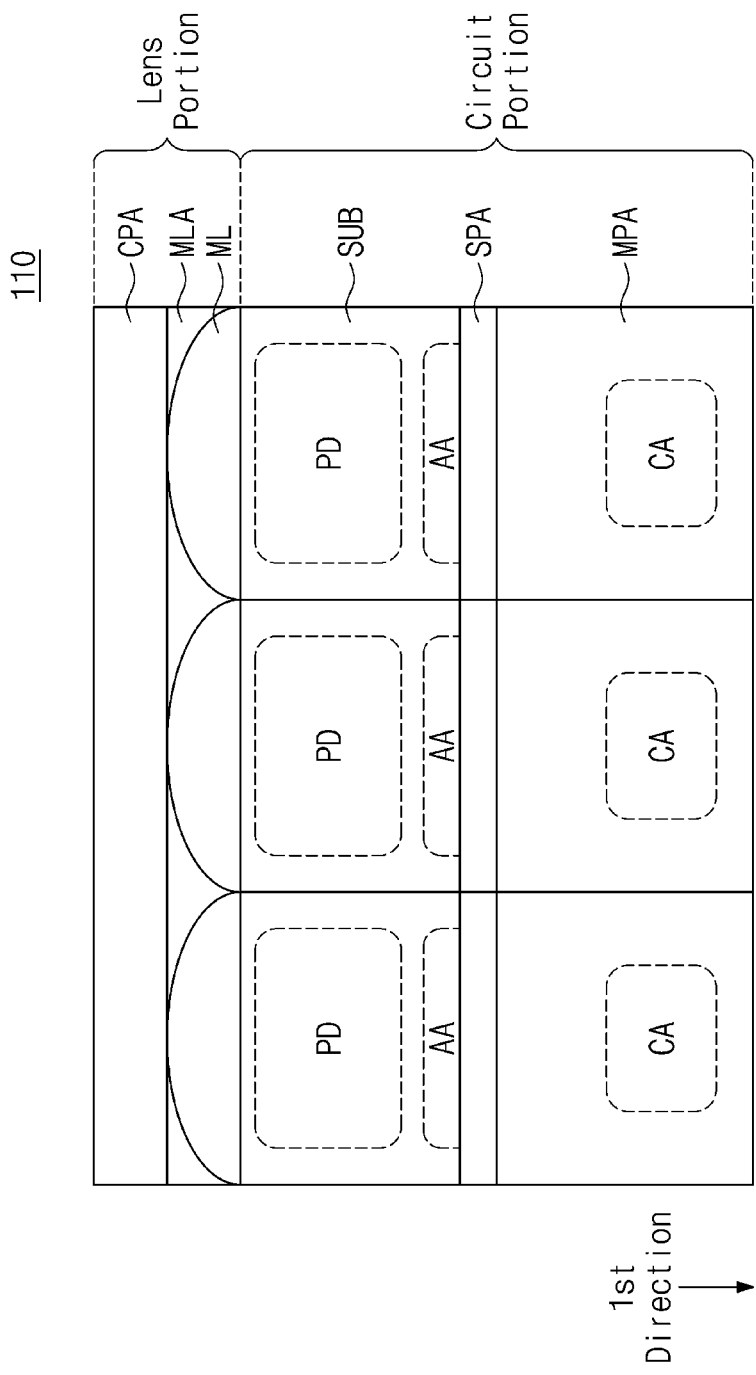
FIG. 11 illustrates an example of a vertical cross-sectional view of a pixel array of an image sensor.

FIG. 11 illustrates an example of a vertical cross-sectional view of the pixel array 110 of the image sensor 100. Referring to FIG. 11, the pixel array 110 of the image sensor 100 may include a circuit portion and a lens portion. The circuit portion may be manufactured along a first direction, and the lens portion may be manufactured along a direction facing away from the first direction. In the circuit portion, the terms "on" and "over" may mean the first direction. In the lens portion, the terms "on" and "over" may mean the direction opposite the first direction.

The circuit portion may include a substrate SUB, a semiconductor pattern area SPA, and a metal pattern area MPA. The substrate SUB may include the photo diodes PD and active areas AA. The photo diodes PD may be formed in a lower portion of the substrate SUB. The active areas AA for forming transistors may be provided over the photo diodes PD.

The semiconductor pattern area SPA may be provided on the substrate SUB. The semiconductor pattern area SPA may include semiconductor patterns forming the transistors together with the active areas AA. For example, the semiconductor patterns may include polysilicon patterns.

The metal pattern area MPA may be provided on the semiconductor pattern area SPA. The metal pattern area MPA may include metal patterns for interconnecting the transistors, metal patterns for a contact with an active area, and metal patterns for interconnecting the metal patterns. The metal patterns may include, for example, a plurality of horizontal wiring layers, connected by vertical wiring layers, such as vias, and all formed within an insulating layer (which may be formed by a plurality of layers of insulating material). Transistor gates may be formed at an interface between the semiconductor pattern area SPA and the metal pattern area MPA.

The metal pattern area MPA may include a capacitor area CA. The capacitor area CA may include capacitors that are formed by using the metal patterns. For example, all of the first capacitor C1, the second capacitor C2, the third capacitor C3, the fourth capacitor C4, the fifth capacitor C5, and the sixth capacitor C6 described with reference to FIGS. 3 to 10 may be provided in the capacitor area CA.

The capacitors of the capacitor area CA may be capacitors that have the same type and are manufactured by the same process. For example, the capacitors of the capacitor area CA may include OCS (One Cylinder Stack) type capacitors or pillar type capacitors, and may be formed at the same vertical level within the capacitor area CA and within the circuit portion. The process for forming the capacitors of the capacitor area CA may include, for example, depositing capacitor nodes and dielectric layers between the capacitor nodes. Because the capacitors are manufactured by the same process, the overhead that is caused by an increase in the number of capacitors may be minimized.

The lens portion may include a micro lens area MLA and a color filter area CPA. The micro lens area MLA may include micro lenses ML respectively corresponding to a plurality of pixels. The micro lenses ML may focus an incident light so as to be transferred to the circuit portion.

The color filter area CPA may be provided on the micro lens area MLA (e.g., along an opposite direction for the first direction). In one embodiment, the color filter area CPA may include red, green, and blue color filters. In an embodiment, one color filter may be provided at one pixel, or one color filter may be provided in common at two or more pixels.

Figure 12:
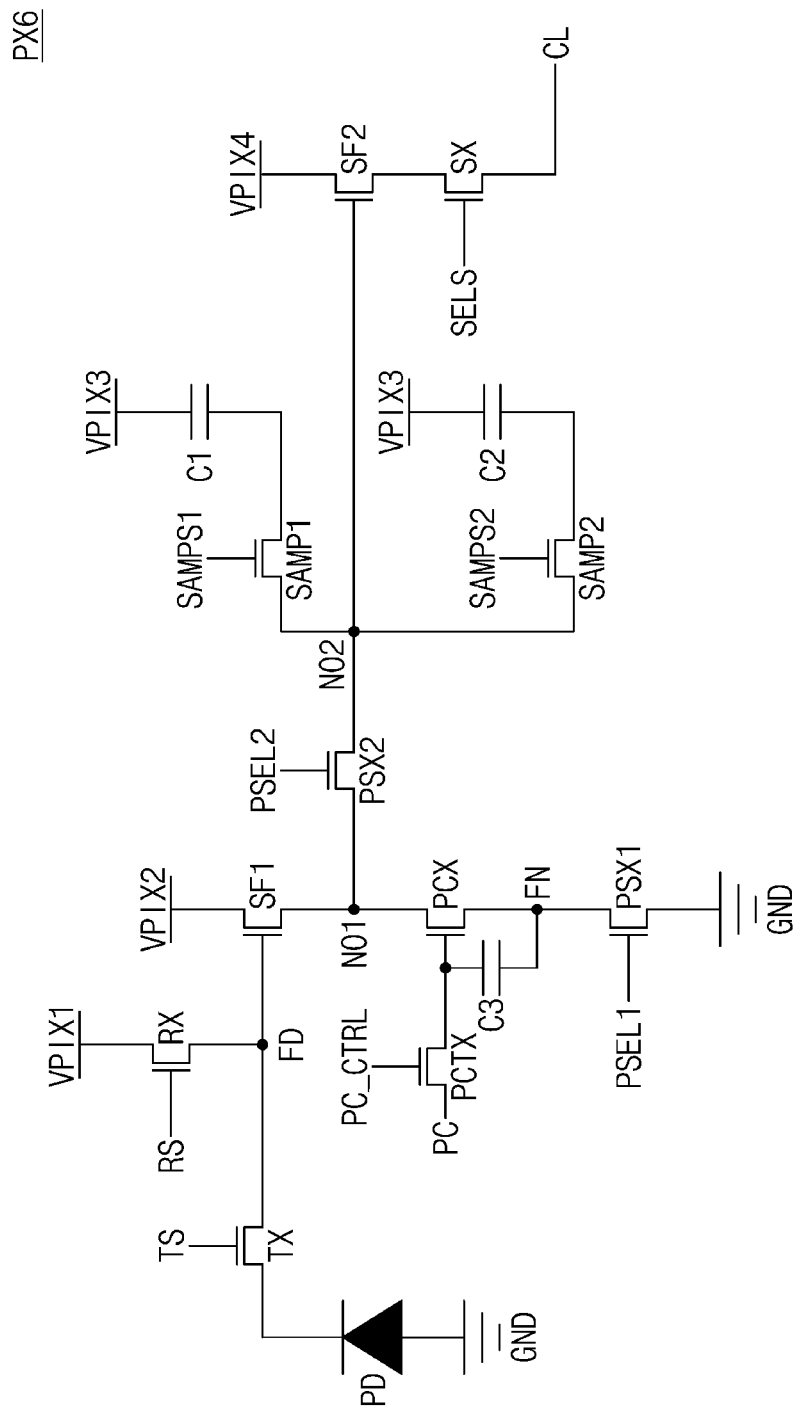
FIG. 12 illustrates an example of a pixel according to another embodiment of the present disclosure.

FIG. 12 illustrates an example of a pixel PX6 according to another embodiment of the present disclosure. Referring to FIG. 12, the pixel PX6 of the image sensor 100 may include the photo diode PD, the transfer transistor TX, the reset transistor RX, the first source follower transistor SF1, the precharge transistor PCX, the first precharge select transistor PSX1, the second precharge select transistor PSX2, the first sampling transistor SAMP1, the first capacitor C1, the second sampling transistor SAMP2, the second capacitor C2, the second source follower transistor SF2, the select transistor SX, the third capacitor C3, and a precharge control transistor PCTX.

Configurations and operations of the photo diode PD, the transfer transistor TX, the reset transistor RX, the first source follower transistor SF1, the precharge transistor PCX, the first precharge select transistor PSX1, the second precharge select transistor PSX2, the first sampling transistor SAMP1, the first capacitor C1, the second sampling transistor SAMP2, the second capacitor C2, the second source follower transistor SF2, the select transistor SX, and the third capacitor C3 may be identical to those of the photo diode PD, the transfer transistor TX, the reset transistor RX, the first source follower transistor SF1, the precharge transistor PCX, the first precharge select transistor PSX1, the second precharge select transistor PSX2, the first sampling transistor SAMP1, the first capacitor C1, the second sampling transistor SAMP2, the second capacitor C2, the second source follower transistor SF2, the select transistor SX, and the third capacitor C3 described with reference to FIG. 3. Thus, additional description will be omitted to avoid redundancy.

In an embodiment, compared to the pixel PX of FIG. 3, the pixel PX6 may further include the precharge control transistor PCTX. The precharge control transistor PCTX may include a gate to which a precharge control signal PC_CTRL is applied, a first terminal to which the precharge signal PC is applied, and a second terminal connected to the gate of the precharge transistor PCX.

In an embodiment, the precharge control signal PC_CTRL and the precharge control signal PC may have the high level while the reset control signal RS or the transfer control signal TS has the high level and may have the low level while the reset control signal RS or the transfer control signal TS has the low level. As another example, a time period in which the precharge control signal PC_CTRL and the precharge control signal PC have the high level may be shorter in length than a time period in which the reset control signal RS or the transfer control signal TS has the high level and may be included in the time period in which the reset control signal RS or the transfer control signal TS has the high level.

When the precharge control signal PC_CTRL and the precharge control signal PC are at the high level, the gate of the precharge transistor PCX may be charged with a voltage of the precharge control signal PC (e.g., a voltage of the high level). When the precharge control signal PC_CTRL and the precharge control signal PC are at the low level, the gate of the precharge transistor PCX may be floated. Through the third capacitor C3, a difference between the gate voltage of the precharge transistor PCX and the voltage of the floating node FN may be maintained. Because both the floating node FN and the gate of the precharge transistor PCX are floated, the effect that the voltage difference is maintained by the third capacitor C3 may be further improved.

In different embodiments, the pixel PX1 described with reference to FIG. 5, the pixel PX2 described with reference to FIG. 6, the pixel PX3 described with reference to FIG. 8, the pixel PX4 described with reference to FIG. 9, and the pixel PX6 described with reference to FIG. 10 may be implemented such that the precharge control transistor PCTX is connected to the gate of the precharge transistor PCX; in this case, the precharge control signal PC may be transferred to the gate of the precharge transistor PCX through the precharge control transistor PCTX.

Figure 13:
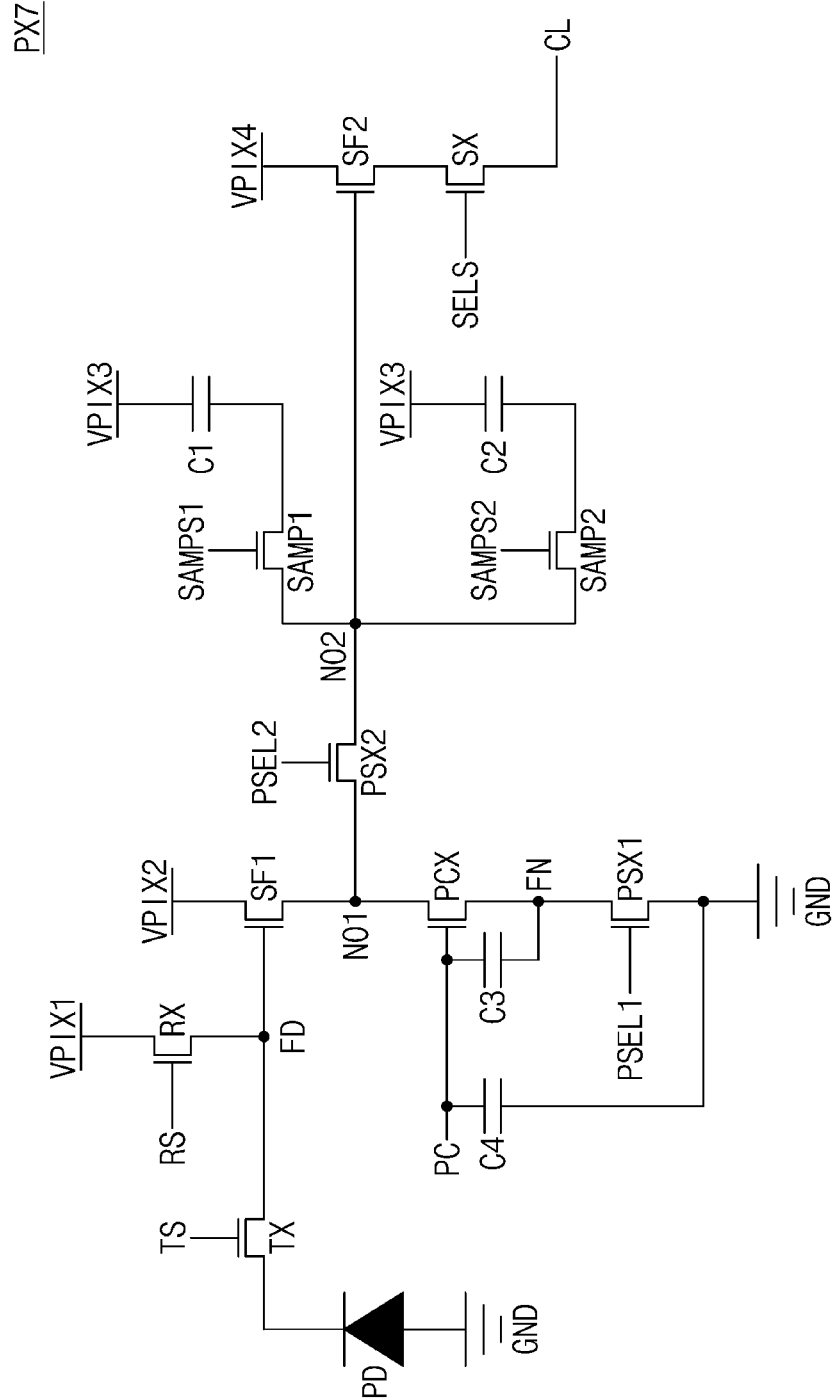
FIG. 13 illustrates an example of a pixel according to another embodiment of the present disclosure.

FIG. 13 illustrates an example of a pixel PX7 according to another embodiment of the present disclosure. Referring to FIG. 13, the pixel PX7 of the image sensor 100 may include the photo diode PD, the transfer transistor TX, the reset transistor RX, the first source follower transistor SF1, the precharge transistor PCX, the first precharge select transistor PSX1, the second precharge select transistor PSX2, the first sampling transistor SAMP1, the first capacitor C1, the second sampling transistor SAMP2, the second capacitor C2, the second source follower transistor SF2, the select transistor SX, the third capacitor C3, and a fourth capacitor C4.

Configurations and operations of the photo diode PD, the transfer transistor TX, the reset transistor RX, the first source follower transistor SF1, the precharge transistor PCX, the first precharge select transistor PSX1, the second precharge select transistor PSX2, the first sampling transistor SAMP1, the first capacitor C1, the second sampling transistor SAMP2, the second capacitor C2, the second source follower transistor SF2, the select transistor SX, and the third capacitor C3 may be identical to those of the photo diode PD, the transfer transistor TX, the reset transistor RX, the first source follower transistor SF1, the precharge transistor PCX, the first precharge select transistor PSX1, the second precharge select transistor PSX2, the first sampling transistor SAMP1, the first capacitor C1, the second sampling transistor SAMP2, the second capacitor C2, the second source follower transistor SF2, the select transistor SX, and the third capacitor C3 described with reference to FIG. 3. Thus, additional description will be omitted to avoid redundancy.

In an embodiment, compared to the pixel PX of FIG. 3, the pixel PX7 may further include the fourth capacitor C4. The fourth capacitor C4 may be connected between the gate of the precharge transistor PCX and the ground node. The fourth capacitor C4 may stabilize a voltage of the gate of the precharge transistor PCX.

The third capacitor C3 may stabilize the voltage difference between the gate of the precharge transistor PCX and the floating node FN, and the fourth capacitor C4 may stabilize the voltage difference between the gate of the precharge transistor PCX and the ground node.

In other embodiments, in the pixel PX1 described with reference to FIG. 5, the pixel PX2 described with reference to FIG. 6, the pixel PX3 described with reference to FIG. 8, the pixel PX4 described with reference to FIG. 9, and the pixel PX6 described with reference to FIG. 10, the fourth capacitor C4 may be added.

Also, as described with reference to FIG. 12, the precharge control transistor PCTX may be connected to the gate of the precharge transistor PCX, and the precharge control signal PC may be transferred to the gate of the precharge transistor PCX through the precharge control transistor PCTX. The fourth capacitor C4 may be connected between a connection node of the gate of the precharge control transistor PCTX and the gate of the precharge transistor PCX and the ground node.

Figure 14:
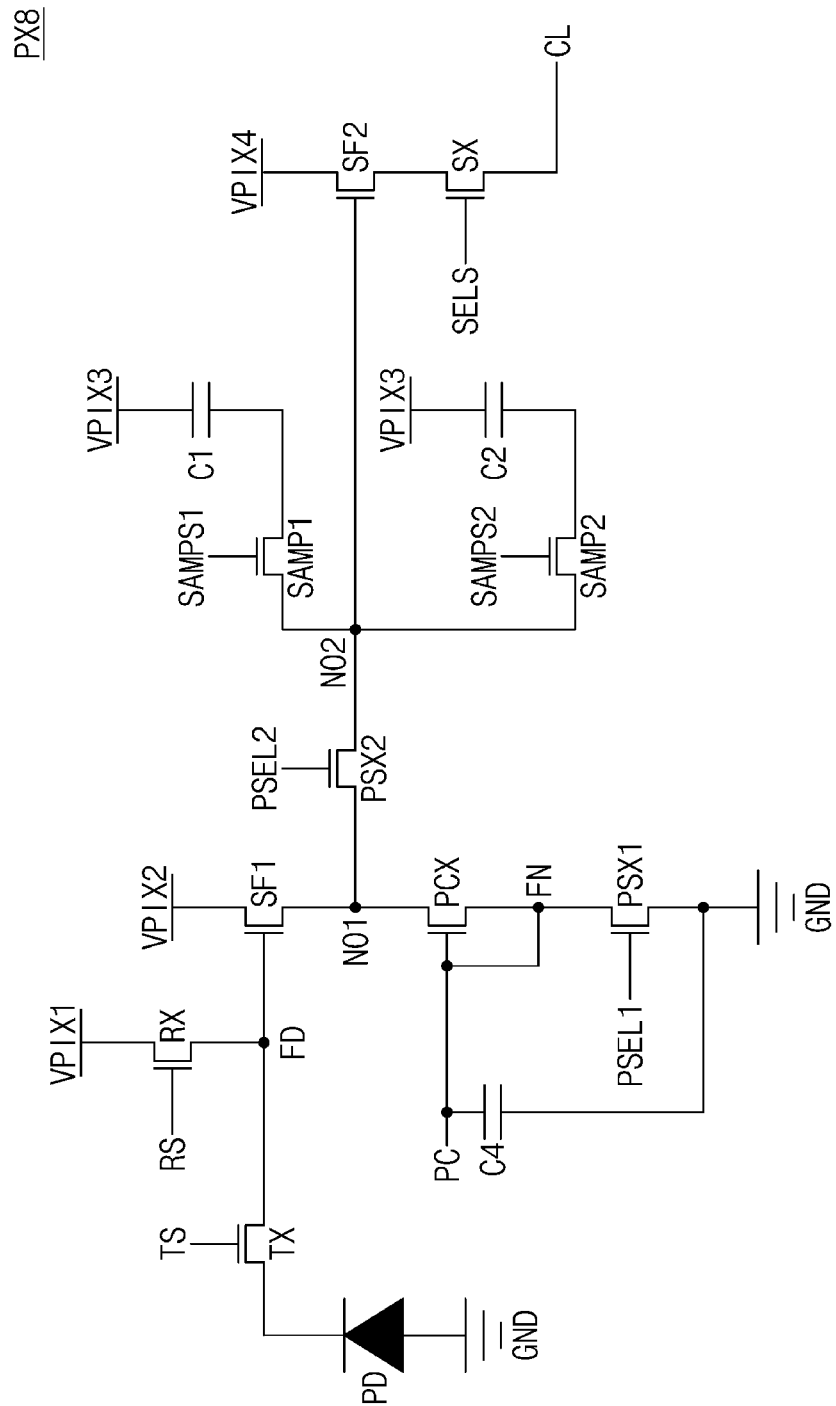
FIG. 14 illustrates an example of a pixel according to another embodiment of the present disclosure.

FIG. 14 illustrates an example of a pixel PX8 according to another embodiment of the present disclosure. Referring to FIG. 14, the pixel PX8 of the image sensor 100 may include the photo diode PD, the transfer transistor TX, the reset transistor RX, the first source follower transistor SF1, the precharge transistor PCX, the first precharge select transistor PSX1, the second precharge select transistor PSX2, the first sampling transistor SAMP1, the first capacitor C1, the second sampling transistor SAMP2, the second capacitor C2, the second source follower transistor SF2, the select transistor SX, and a fourth capacitor C4.

Configurations and operations of the photo diode PD, the transfer transistor TX, the reset transistor RX, the first source follower transistor SF1, the precharge transistor PCX, the first precharge select transistor PSX1, the second precharge select transistor PSX2, the first sampling transistor SAMP1, the first capacitor C1, the second sampling transistor SAMP2, the second capacitor C2, the second source follower transistor SF2, and the select transistor SX may be identical to those of the photo diode PD, the transfer transistor TX, the reset transistor RX, the first source follower transistor SF1, the precharge transistor PCX, the first precharge select transistor PSX1, the second precharge select transistor PSX2, the first sampling transistor SAMP1, the first capacitor C1, the second sampling transistor SAMP2, the second capacitor C2, the second source follower transistor SF2, and the select transistor SX are described with reference to FIG. 3. Thus, additional description will be omitted to avoid redundancy.

Compared to the pixel PX7 of FIG. 13, the pixel PX8 may not include the third capacitor C3. The fourth capacitor C4 may stabilize a voltage of the gate of the precharge transistor PCX.

In different embodiments, in the pixel PX1 described with reference to FIG. 5, the pixel PX2 described with reference to FIG. 6, the pixel PX3 described with reference to FIG. 8, the pixel PX4 described with reference to FIG. 9, and the pixel PX6 described with reference to FIG. 10, the fourth capacitor C4 may be provided instead of the third capacitor C3. In the above example embodiments, at least one capacitor (e.g., either C3 or C4, or both C3 and C4) is provided between a connection node of a gate of the precharge transistor PCX and a ground node, and/or between the connection node of a gate of the precharge transistor PCX and a floating node.

Also, as described with reference to FIG. 12, the precharge control transistor PCTX may be connected to the gate of the precharge transistor PCX, and the precharge control signal PC may be transferred to the gate of the precharge transistor PCX through the precharge control transistor PCTX. The fourth capacitor C4 may be connected between a connection node of the gate of the precharge control transistor PCTX and the gate of the precharge transistor PCX and the ground node.

In the above embodiments, components according to the present disclosure are described by using the terms "first", "second", "third", etc. However, the terms "first", "second", "third", etc. may be used to distinguish components from each other and do not limit the present disclosure. For example, unless the context clearly indicates otherwise, the terms "first", "second", "third", etc. do not involve an order or a numerical meaning of any form. Also, terms that are not described using "first," "second," etc., in the specification, may still be referred to as "first" or "second" in a claim. In addition, a term that is referenced with a particular number (e.g., "first" in a particular claim) may be described elsewhere with a different number (e.g., "second" in the specification or another claim).

In the above embodiments, components according to embodiments of the present disclosure are referenced by using blocks. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit, or circuits enrolled as an intellectual property (IP).

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact. Other words used to describe the relationship between elements should be interpreted in a like fashion (e.g., "between" versus "directly between," "adjacent" versus "directly adjacent," etc.).

According to embodiments of the present disclosure, a capacitor is provided between a gate of a precharge transistor and a floating node. Accordingly, the amount of current flowing through the precharge transistor may be prevented from changing, and an image quality of image data may be prevented from being degraded.

While the present disclosure has been described with reference to embodiments thereof, it will be apparent to those of ordinary skill in the art that various changes and modifications may be made thereto without departing from the spirit and scope of the present disclosure.

What is claimed is:

1. An image sensor comprising:
a plurality of pixels connected to a plurality of row lines and a plurality of column lines,
wherein each of the plurality of pixels includes:
a photo diode;
a transfer transistor connected between the photo diode and a floating diffusion node;
a reset transistor connected between the floating diffusion node and a first power node to which a first power supply voltage is applied;
a first source follower transistor including a gate connected to the floating diffusion node, a first terminal connected to a second power node to which a second power supply voltage is applied, and a second terminal connected to a first node;
a precharge transistor connected between the first node and a floating node;
a first precharge select transistor connected between the floating node and a ground node;
a second precharge select transistor connected between the first node and a second node; and
a first capacitor connected between a gate of the precharge transistor and the floating node.

2. The image sensor of claim 1, wherein each of the plurality of pixels further includes:
a substrate including the photo diode and an active area;
a semiconductor pattern area on the substrate and forming the transfer transistor, the reset transistor, the first source follower transistor, the precharge transistor, the first precharge select transistor, and the second precharge select transistor together with the active area; and
a metal pattern area on the semiconductor pattern area and including the plurality of row lines, the plurality of column lines, and the first capacitor, on the semiconductor pattern area.

3. The image sensor of claim 2, wherein each of the plurality of pixels further includes:
a second capacitor and a first sampling transistor connected between a third power node to which a third power supply voltage is applied and the second node;
a third capacitor and a second sampling transistor connected between the third power node and the second node;
a second source follower transistor including a gate connected to the second node, a first terminal to which a fourth power supply voltage is applied, and a second terminal; and
a select transistor connected to the second terminal of the second source follower transistor and a corresponding column line among the plurality of column lines, and
wherein the first capacitor, the second capacitor, and the third capacitor are manufactured by the same process.

4. The image sensor of claim 3, wherein each of the first capacitor, the second capacitor, and the third capacitor includes an OSC (One Cylinder Stack) type capacitor or a pillar type capacitor.

5. The image sensor of claim 3, further comprising:
a row driver connected to the plurality of row lines,
wherein the row driver is configured to:
reset a voltage level of the floating diffusion node of each of the plurality of pixels by turning on the reset transistor of each of the plurality of pixels simultaneously;
store a voltage corresponding to a reset level of the floating diffusion node in the second capacitor through the first sampling transistor of each of the plurality of pixels;
dump electrons generated by the photo diode of each of the plurality of pixels to the floating diffusion node by turning on the transfer transistor of each of the plurality of pixels simultaneously; and
store a voltage corresponding to a voltage level of the floating diffusion node, to which the electrons are dumped, through the second sampling transistor of each of the plurality of pixels.

6. The image sensor of claim 5, wherein the row driver is configured to:
sequentially select the plurality of row lines; and
simultaneously turn on select transistors of selected pixels connected to the selected row line such that voltages corresponding to voltages of the second capacitor and of the third capacitor of each of the selected pixels are sequentially transferred to the column lines.

7. The image sensor of claim 3, wherein each of the plurality of pixels further includes:
a dynamic conversion gain transistor connected between the floating diffusion node and the reset transistor; and
a fourth capacitor and a third sampling transistor connected in series between the third power node and the second node.

8. The image sensor of claim 1, wherein each of the plurality of pixels further includes:
a second photo diode; and
a second transfer transistor connected between the second photo diode and the floating diffusion node.

9. The image sensor of claim 1, further comprising:
a precharge control transistor including a gate to which a precharge control signal is input, a first terminal to which a precharge signal is input, and a second terminal connected to the gate of the precharge transistor.

10. The image sensor of claim 9, configured such that, while a reset control signal applied to a gate of the reset transistor has a high level, the precharge signal and the precharge control signal have the high level, and
while the reset control signal applied to the gate of the reset transistor has a low level, the precharge signal and the precharge control signal have the low level.

11. The image sensor of claim 9, configured such that, while a transfer control signal applied to a gate of the transfer transistor has a high level, the precharge signal and the precharge control signal have the high level, and
while the transfer control signal applied to the gate of the transfer transistor has a low level, the precharge signal and the precharge control signal have the low level.

12. The image sensor of claim 9, further comprising:
a second capacitor connected between the gate of the precharge transistor and the ground node.

13. The image sensor of claim 1, further comprising:
a second capacitor connected between the gate of the precharge transistor and the ground node.

14. The image sensor of claim 1, wherein each of the plurality of pixels further includes:
a second capacitor and a first sampling transistor connected between a third power node to which a third power supply voltage is applied and the second node;
a third capacitor and a second sampling transistor connected between the third power node and the second node;
a second source follower transistor including a gate connected to the second node, a first terminal to which a fourth power supply voltage is applied, and a second terminal;
a select transistor connected to the second terminal of the second source follower transistor and a corresponding column line among the plurality of column lines;
a second photo diode;
a second transfer transistor connected between the second photo diode and a second floating diffusion node;
a second reset transistor connected between the second floating diffusion node and the first power node;
a third source follower transistor including a gate connected to the second floating diffusion node, a first terminal connected to the second power node, and a second terminal connected to a third node;
a second precharge transistor connected between the third node and the floating node;
a third precharge select transistor connected between the third node and a fourth node;
a fourth capacitor and a third sampling transistor connected between the third power node and the fourth node;
a fifth capacitor and a fourth sampling transistor connected between the third power node and the fourth node;
a first switch connected between the second node and the gate of the second source follower transistor;
a second switch connected between the fourth node and the gate of the second source follower transistor; and
a sixth capacitor connected between a gate of the second precharge transistor and the floating node.

15. The image sensor of claim 14, wherein each of the plurality of pixels further includes:
a substrate including the photo diode and an active area;
a semiconductor pattern area on the substrate and forming the transfer transistor, the reset transistor, the first source follower transistor, the precharge transistor, the first precharge select transistor, the second precharge select transistor, the first sampling transistor, the second sampling transistor, the second source follower transistor, the select transistor, the second transfer transistor, the second reset transistor, the third source follower transistor, the second precharge transistor, the third precharge select transistor, the third sampling transistor, the fourth sampling transistor, the first switch, and the second switch together with the active area; and
a metal pattern area on the semiconductor pattern area and including the plurality of row lines, the plurality of column lines, the first capacitor, the second capacitor, the third capacitor, the fourth capacitor, the fifth capacitor, and the sixth capacitor.

16. The image sensor of claim 15, wherein the first capacitor, the second capacitor, the third capacitor, the fourth capacitor, the fifth capacitor, and the sixth capacitor are manufactured by the same process.

17. The image sensor of claim 15, wherein each of the first capacitor, the second capacitor, the third capacitor, the fourth capacitor, the fifth capacitor, and the sixth capacitor includes an OSC (One Cylinder Stack) type capacitor or a pillar type capacitor.

18. The image sensor of claim 1, wherein each of the plurality of pixels further includes:
a second capacitor and a first sampling transistor connected between a third power node to which a third power supply voltage is applied and the second node;
a third capacitor and a second sampling transistor connected between the third power node and the second node;
a second source follower transistor including a gate connected to the second node, a first terminal to which a fourth power supply voltage is applied, and a second terminal;
a select transistor connected to the second terminal of the second source follower transistor and a corresponding column line among the plurality of column lines;
a second photo diode;
a second transfer transistor connected between the second photo diode and the floating diffusion node; and a fourth capacitor and a third sampling transistor connected between the third power node and the second node.

19. An image sensor comprising:
a plurality of pixels connected to a plurality of row lines and a plurality of column lines,
wherein each of the plurality of pixels includes:
a photo diode;
a transfer transistor connected between the photo diode and a floating diffusion node;
a reset transistor connected between the floating diffusion node and a first power node to which a first power supply voltage is applied;
a first source follower transistor including a gate connected to the floating diffusion node, a first terminal connected to a second power node to which a second power supply voltage is applied, and a second terminal connected to a first node;
a first precharge select transistor connected between the first node and a second node;
a precharge transistor connected between the first node and a floating node;
a second precharge select transistor connected between the precharge transistor and a ground node; and
a capacitor connected between a gate of the precharge transistor and the ground node.

20. An image sensor comprising:
a plurality of pixels connected to a plurality of row lines and a plurality of column lines; and
a row driver connected to the plurality of pixels through the plurality of row lines,
wherein each of the plurality of pixels includes:
a photo diode;
a transfer transistor connected between the photo diode and a floating diffusion node;
a reset transistor connected between the floating diffusion node and a first power node to which a first power supply voltage is applied;
a first source follower transistor including a gate connected to the floating diffusion node, a first terminal connected to a second power node to which a second power supply voltage is applied, and a second terminal connected to a first node;
a precharge transistor connected between the first node and a floating node;
a first precharge select transistor connected between the floating node and a ground node;
a second precharge select transistor connected between the first node and a second node;
a first capacitor and a first sampling transistor connected between a third power node to which a third power supply voltage is applied and the second node;
a second capacitor and a second sampling transistor connected between the third power node and the second node;
a second source follower transistor including a gate connected to the second node, a first terminal to which a fourth power supply voltage is applied, and a second terminal;
a select transistor connected to the second terminal of the second source follower transistor and a corresponding column line among the plurality of column lines; and
a third capacitor connected between a gate of the precharge transistor and the floating node,
wherein each of the plurality of pixels further includes:
a substrate including the photo diode and an active area;
a semiconductor pattern area on the substrate and forming the transfer transistor, the reset transistor, the first source follower transistor, the precharge transistor, the first precharge select transistor, the second precharge select transistor, the first sampling transistor, the second sampling transistor, the second source follower transistor, and the select transistor together with the active area; and
a metal pattern area on the semiconductor pattern area and including the plurality of row lines, the plurality of column lines, the first capacitor, the second capacitor, and the third capacitor,
wherein the first capacitor, the second capacitor, and the third capacitor are manufactured by the same process, and
wherein each of the first capacitor, the second capacitor, and the third capacitor includes an OSC (One Cylinder Stack) type capacitor or a pillar type capacitor.

* * * * *